United States Patent
Yoon et al.

(10) Patent No.: US 10,062,571 B2
(45) Date of Patent: Aug. 28, 2018

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Hyun-chul Yoon, Seongnam-si (KR); Kyoung-seon Kim, Suwon-si (KR); Hai-sub Na, Seoul (KR); Jin Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/342,151

(22) Filed: Nov. 3, 2016

(65) Prior Publication Data
US 2017/0213731 A1    Jul. 27, 2017

(30) Foreign Application Priority Data
Jan. 26, 2016    (KR) .................. 10-2016-0009399

(51) Int. Cl.
*H01L 21/02*    (2006.01)
*H01L 21/033*    (2006.01)
(Continued)

(52) U.S. Cl.
CPC ...... *H01L 21/0337* (2013.01); *H01L 21/0273* (2013.01); *H01L 21/02118* (2013.01); *H01L 21/02282* (2013.01); *H01L 21/02299* (2013.01); *H01L 21/02318* (2013.01); *H01L 21/02345* (2013.01); *H01L 21/0332* (2013.01); *H01L 21/0338* (2013.01); *H01L 21/31144* (2013.01); *H01L 21/32139* (2013.01);
(Continued)

(58) Field of Classification Search
CPC ......... H01L 21/03; H01L 21/02; H01L 21/31; H01L 21/32
USPC ............ 438/702, 703; 257/E21.24, E21.214, 257/E21.249, E21.25, E21.261
See application file for complete search history.

(56) References Cited

U.S. PATENT DOCUMENTS

| 5,395,796 A | * | 3/1995 | Haskell | ............ | H01L 21/31055 |
|   |   |   |   |   | 257/E21.245 |
| 6,319,853 B1 | * | 11/2001 | Ishibashi | ............... | G03F 7/0035 |
|   |   |   |   |   | 430/312 |

(Continued)

FOREIGN PATENT DOCUMENTS

| JP | 2014-153665 A | 8/2014 |
| JP | 2015-127796 A | 7/2015 |

(Continued)

*Primary Examiner* — Sheikh Maruf
(74) *Attorney, Agent, or Firm* — Lee & Morse, P.C.

(57) ABSTRACT

A method of manufacturing a semiconductor device includes forming a feature layer on a substrate, forming a plurality of reference patterns, arranged at a first pitch, on the feature layer, forming an organic liner on a side wall of each of the plurality of reference patterns, forming a plurality of buried patterns on the organic liner, removing the organic liner exposed between the plurality of buried patterns and the plurality of reference patterns, and etching the feature layer by using the plurality of buried patterns and the plurality of reference patterns as etch masks to form a feature pattern. Each of the plurality of buried patterns covers a space between side walls of two adjacent reference patterns among the plurality of reference patterns.

20 Claims, 38 Drawing Sheets

(51) Int. Cl.
*H01L 21/027* (2006.01)
*H01L 21/3213* (2006.01)
*H01L 27/11582* (2017.01)
*H01L 21/311* (2006.01)
*H01L 21/3105* (2006.01)

(52) U.S. Cl.
CPC .... *H01L 27/11582* (2013.01); *H01L 21/3105* (2013.01); *H01L 21/31133* (2013.01); *H01L 21/31138* (2013.01)

(56) References Cited

U.S. PATENT DOCUMENTS

| | | | |
|---|---|---|---|
| 6,455,436 B1* | 9/2002 | Ueda | H01L 21/31144 257/E21.257 |
| 7,531,456 B2 | 5/2009 | Kwon et al. | |
| 8,071,484 B2 | 12/2011 | Kim et al. | |
| 8,603,884 B2 | 12/2013 | Sills et al. | |
| 8,647,981 B1* | 2/2014 | Sipani | H01L 21/76802 216/37 |
| 8,728,335 B2 | 5/2014 | Fu et al. | |
| 2006/0281266 A1* | 12/2006 | Wells | H01L 21/0337 438/299 |
| 2007/0148968 A1* | 6/2007 | Kwon | H01L 21/0337 438/671 |
| 2008/0008969 A1* | 1/2008 | Zhou | H01L 21/0337 430/313 |
| 2008/0044769 A1* | 2/2008 | Kozawa | G03F 7/40 430/311 |
| 2008/0085612 A1* | 4/2008 | Smythe | H01L 21/02164 438/787 |
| 2008/0113483 A1* | 5/2008 | Wells | H01L 21/0337 438/424 |
| 2008/0122125 A1* | 5/2008 | Zhou | H01L 21/0338 257/797 |
| 2008/0261349 A1* | 10/2008 | Abatchev | H01L 21/0337 438/106 |
| 2008/0305636 A1* | 12/2008 | Kim | H01L 21/0337 438/696 |
| 2010/0130016 A1* | 5/2010 | DeVilliers | H01L 21/0273 438/703 |
| 2011/0250757 A1* | 10/2011 | Sukekawa | H01L 21/0337 438/703 |
| 2012/0064724 A1 | 3/2012 | Lee et al. | |
| 2012/0248442 A1* | 10/2012 | Yu | G02F 1/133528 257/49 |
| 2012/0322269 A1* | 12/2012 | Sills | H01L 21/0273 438/703 |
| 2015/0340246 A1* | 11/2015 | Woo | H01L 21/32139 438/703 |

FOREIGN PATENT DOCUMENTS

| | | |
|---|---|---|
| KR | 10-2011-0008495 A | 1/2011 |
| KR | 10-1095077 B1 | 12/2011 |

* cited by examiner

B-B'

B-B'

B-B'

B-B'

METHOD OF MANUFACTURING SEMICONDUCTOR DEVICE

CROSS-REFERENCE TO RELATED APPLICATION

Korean Patent Application No. 10-2016-0009399, filed on Jan. 26, 2016, in the Korean Intellectual Property Office, and entitled: "Method of Manufacturing Semiconductor Device," is incorporated by reference herein in its entirety.

BACKGROUND

1. Field

Embodiments relate to a method of manufacturing a semiconductor device, and more particularly, to a method of manufacturing a semiconductor device including a fine pattern.

2. Description of the Related Art

With the trend of electronic products to be light, thin, short, and miniaturized, the demand for implementing a fine pattern of semiconductor devices is increasing. Therefore, pattern forming technology such as double patterning technology (DPT) or quadrature patterning technology (QPT) is being developed.

SUMMARY

Embodiments are directed to a method of manufacturing a semiconductor device including forming a feature layer on a substrate, forming a plurality of reference patterns, arranged at a first pitch, on the feature layer, forming an organic liner on a side wall of each of the plurality of reference patterns, forming a plurality of buried patterns on the organic liner, each of the plurality of buried patterns covering a space between side walls of two adjacent reference patterns among the plurality of reference patterns, removing the organic liner exposed between the plurality of buried patterns and the plurality of reference patterns, and etching the feature layer by using the plurality of buried patterns and the plurality of reference patterns as etch masks to form a feature pattern.

Embodiments are also directed to a method of manufacturing a semiconductor device including forming a feature layer on a substrate, forming a plurality of reference patterns, arranged at a first pitch, on the feature layer, forming an organic coating layer on the plurality of reference patterns, the organic coating layer including an organic compound, performing a first baking treatment to self-align the organic compound included in the organic coating layer on a side wall and a top of each of the plurality of reference patterns to form an organic liner on the side wall of each of the plurality of reference patterns, forming a plurality of buried patterns on the organic liner, each of the plurality of buried patterns covering a space between side walls of two adjacent reference patterns among the plurality of reference patterns, removing the organic liner exposed between the plurality of buried patterns and the plurality of reference patterns; and etching the feature layer by using the plurality of buried patterns and the plurality of reference patterns as etch masks to form a feature pattern Embodiments are also directed to a method of manufacturing a semiconductor device including forming a feature layer on a substrate, the substrate including main pattern region and an edge region, and forming a preliminary reference pattern layer on an inorganic material on the feature layer, forming a plurality of reference patterns arranged at a first pitch from the preliminary reference pattern layer in the main pattern region and forming an edge pattern from the preliminary reference pattern layer in the edge region, performing a surface treatment on the reference patterns in the main pattern region and on a edge pattern in the edge region such that exposed surfaces of the reference patterns and the edge pattern are hydrophilic, forming an organic coating layer on the reference patterns and the edge pattern, the organic coating layer including an organic compound having a hydrophilic functional group, performing a baking treatment such that the organic compound included in the organic coating layer self-aligns with surfaces of the reference patterns and the edge pattern to form an organic liner on side walls and tops of the reference patterns and the edge pattern, removing portions of the organic coating layer that were not self-aligned with surfaces of the reference patterns and the edge pattern to form the organic liner in the first baking treatment, such that the organic liner remains on side walls and tops of the reference patterns and the edge pattern, forming a plurality of buried patterns of an inorganic material on the organic liner, the buried patterns filling spaces between side walls of adjacent reference patterns, removing portions of the organic liner that are between the buried patterns and reference patterns, and etching the feature layer using the buried patterns and the reference patterns as etch masks to form a feature pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
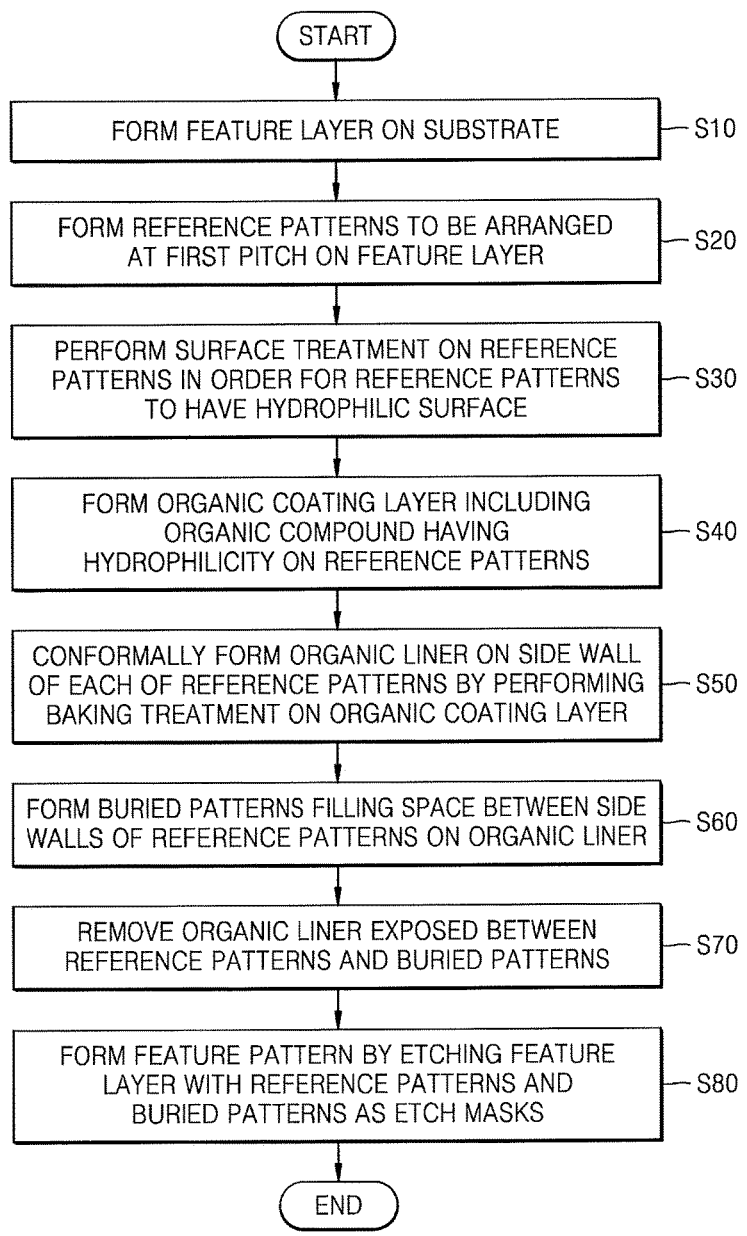
FIG. 1 illustrates a flowchart depicting a method of manufacturing a semiconductor device, according to embodiments.

FIG. 1 illustrates a flowchart of a method of manufacturing a semiconductor device according to embodiments.

FIGS. 2 to 14 illustrate cross-sectional views according to stages of a method of manufacturing a semiconductor device according to embodiments. FIGS. 2 to 14 exemplarily illustrate a method of manufacturing a semiconductor device including a line-shaped feature pattern 120P by using double patterning technology (DPT).

Figure 2:
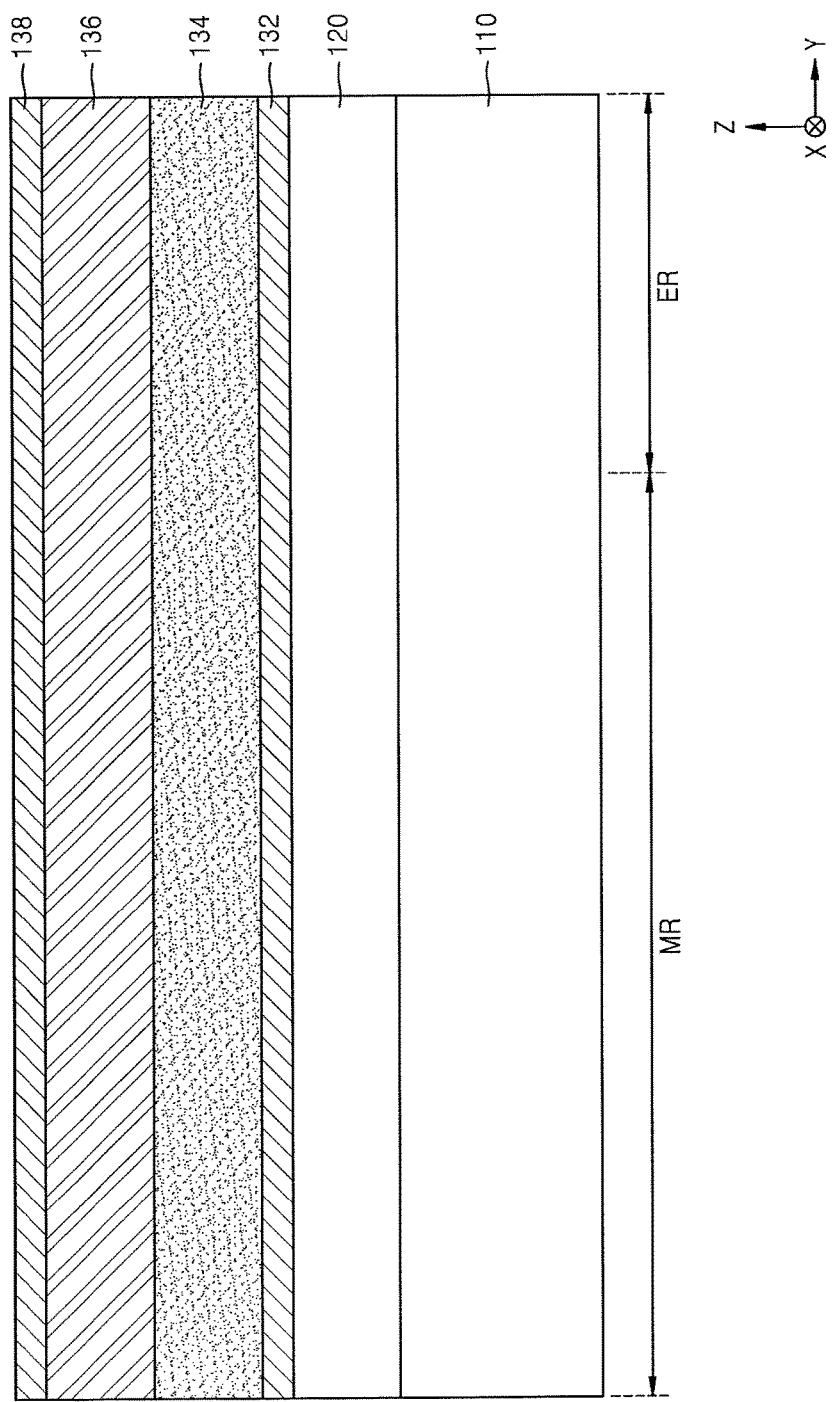
FIGS. 2 to 14 illustrate cross-sectional views according to stages of a method of manufacturing a semiconductor device according to embodiments.

Referring to FIGS. 1 and 2, in operation S10, a feature layer 120 may be formed on a substrate 110.

The substrate 110 may include a semiconductor substrate. In some implementations, the substrate 110 may be formed of a semiconductor such as silicon (Si), germanium (Ge), or the like. In some implementations, the substrate 110 may include a compound semiconductor such as SiGe, SiC, GaAs, InAs, InP, or the like. In some implementations, the substrate 110 may have a silicon-on insulator (SOI) structure. The substrate 110 may include a conductive region, for example, an impurity-doped well or an impurity-doped structure. Also, the substrate 110 may have various isolation structures such as a shallow trench isolation (STI) structure.

The substrate 110 may include a main pattern region MR and an edge region ER. In some implementations, the main pattern region MR may be a cell region where a plurality of memory cells are to be formed, and the edge region ER may be a peripheral circuit region where a plurality of peripheral circuits configured to drive the memory cells are to be formed. In some implementations, the main pattern region MR may be a first region of a cell region where a plurality of line patterns having a narrow width are to be formed, and the edge region ER may be a second region of the cell region where a plurality of line patterns having a wide width are to be formed. In some implementations, the main pattern region MR may be a line pattern region where a plurality of line patterns having a narrow width are to be formed, and the edge region ER may be an outer circumference region disposed around the line patterns.

The feature layer 120 may be a target layer that is to be finally patterned in a subsequent process. In some implementations, the feature layer 120 may include an insulating material or a conductive material. For example, the feature layer 120 may be formed of metal, an alloy, metal carbide, metal nitride, metal oxynitride, metal oxycarbide, a semiconductor, polysilicon, oxide, nitride, oxynitride, a hydrocarbon compound, or a combination thereof. The feature layer 120 may be formed of the same material as that of the substrate 110 or may be formed of a material different from that of the substrate 110. When the feature layer 120 and the substrate 110 are formed of different materials, the feature layer 120 and the substrate 110 may have the same etching rate, similar etching rates, or different etching rates.

In some implementations, a material layer may be formed between the substrate 110 and the feature layer 120.

Subsequently, a first mask layer 132 may be formed on the feature layer 120. The first mask layer 132 may be formed of, for example, metal, an alloy, metal carbide, metal nitride, metal oxynitride, metal oxycarbide, a semiconductor, polysilicon, oxide, nitride, oxynitride, a hydrocarbon compound, or a combination thereof. The first mask layer 132 may include a material having a sufficient etch selectivity with respect to the feature layer 120. For example, when the feature layer 120 includes polysilicon, the first mask layer 132 may include silicon oxynitride or silicon nitride.

A preliminary reference pattern layer 134 may be formed on the first mask layer 132. The preliminary reference pattern layer 134 may be formed of, for example, metal, an alloy, metal carbide, metal nitride, metal oxynitride, metal oxycarbide, a semiconductor, polysilicon, an oxide, a nitride, an oxynitride, a hydrocarbon compound, or a combination thereof. The preliminary reference pattern layer 134 may include a material having a sufficient etch selectivity with respect to the first mask layer 132 and the feature layer 120. For example, when the first mask layer 132 includes silicon oxynitride or silicon nitride, the preliminary reference pattern layer 134 may include silicon oxide or silicon oxynitride.

A first material layer 136 may be formed on the preliminary reference pattern layer 134. The first material layer 136 may include a carbon-based material layer. For example, the first material layer 136 may include an amorphous carbon layer (ACL) or a spin-on hardmask (SOH) material. The SOH material may be formed of, for example, a hydrocarbon compound having a relatively high carbon content of about 85 wt % to about 99 wt % with respect to a total weight of the SOH material, or a derivative thereof.

In an exemplary process of forming the first material layer 136 with the SOH material, an organic compound layer having a thickness of about 500 Å to about 5,000 Å may be formed on the preliminary reference pattern layer 134 by a spin coating process. The organic compound layer may be formed of, for example, a hydrocarbon compound including an aromatic ring such as phenyl, benzene, or naphthalene ring, or derivatives thereof. The organic compound layer may be formed of a material having a relatively high carbon content of about 85 wt % to about 99 wt % with respect to a total weight thereof, or derivatives thereof. A carbon-containing layer may be formed, for example, by a primary baking process including baking the organic compound layer at a temperature of about 150° C. to about 350° C. The primary baking process may be performed for about 30 seconds to about 300 seconds. Subsequently, the carbon-containing layer may be cured by a secondary baking process including baking the carbon-containing layer for about 30 seconds to about 300 seconds at a temperature of about 300° C. to about 550° C. When the carbon-containing layer is cured through a process of baking twice, damage to the carbon-containing layer may be avoided when another material is formed on the carbon-containing layer in a deposition process although the deposition process is performed at a relative temperature of about 400° C. or more.

A second mask layer 138 may be formed on the first material layer 136. The second mask layer 138 may be formed of, for example, metal, an alloy, metal carbide, metal nitride, metal oxynitride, metal oxycarbide, a semiconductor, polysilicon, oxide, nitride, oxynitride, a hydrocarbon compound, or a combination thereof. The second mask layer 138 may include a material having a sufficient etch selectivity with respect to the first material layer 136. For example, when the first material layer 136 includes an SOH material, the second mask layer 138 may include at least one of silicon oxynitride, silicon nitride, and silicon oxide.

Figure 3:
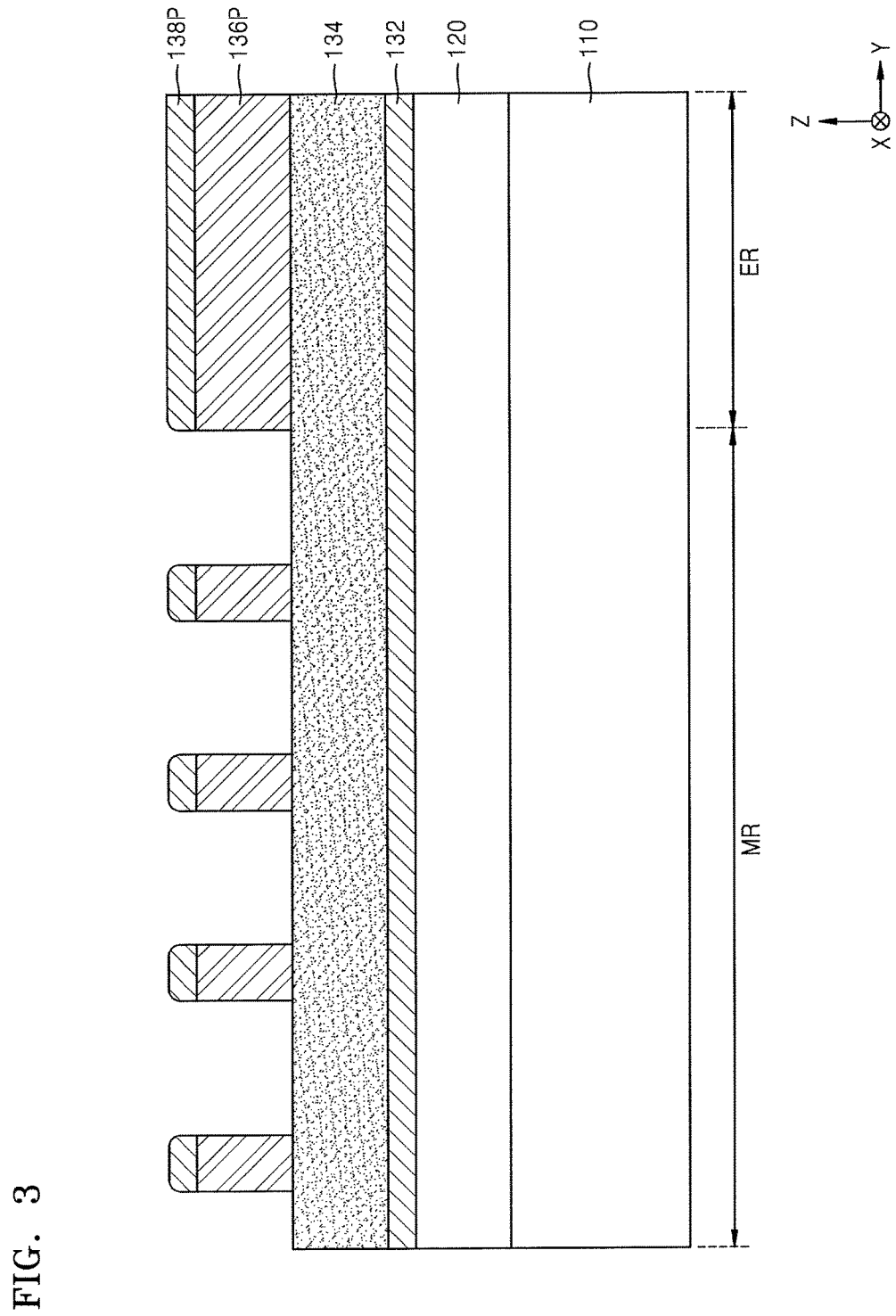
Figure 4:
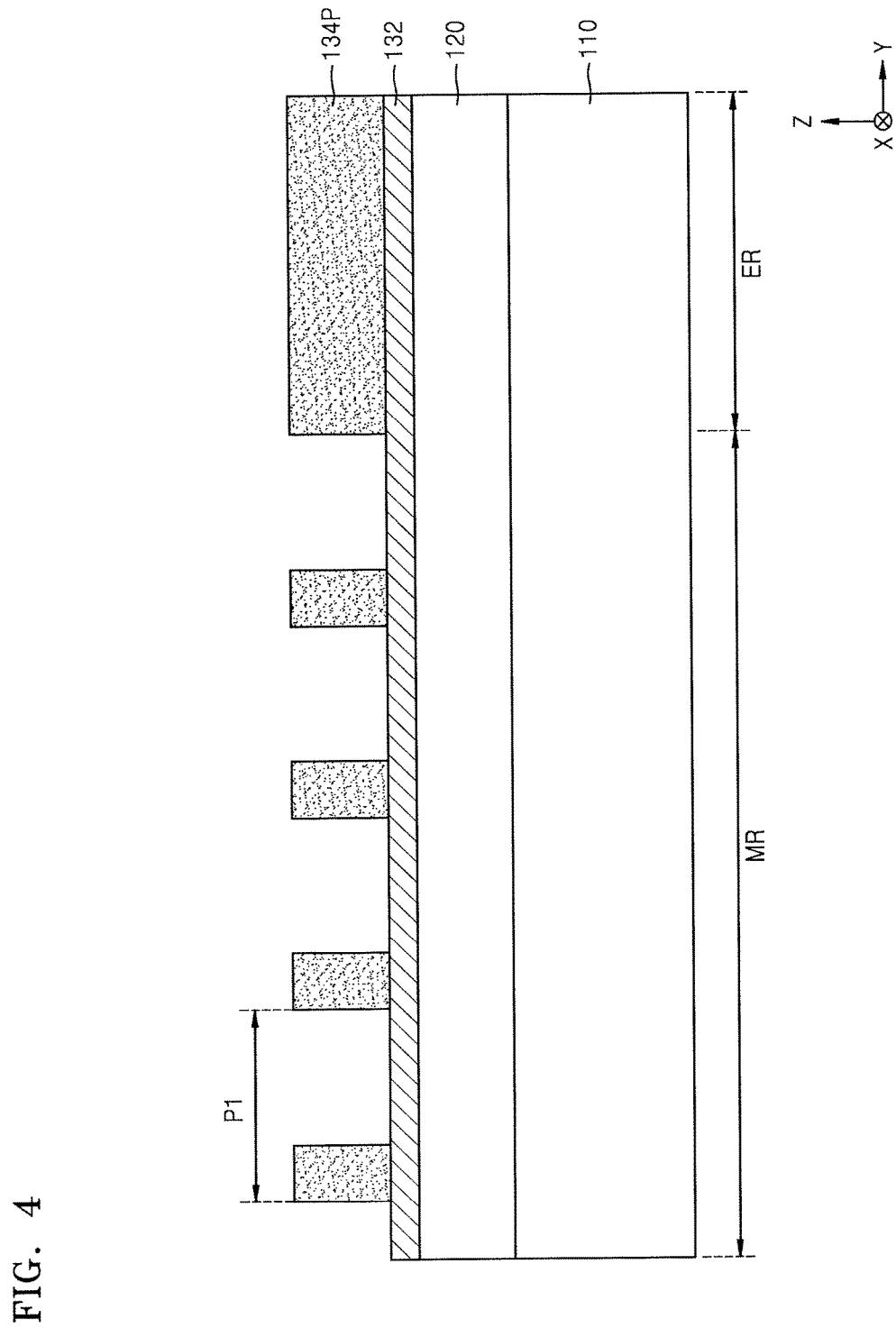

Referring to FIGS. 1, 3, and 4, in operation S20, a plurality of reference patterns 134P may be formed at a first pitch P1 on the feature layer 120.

In an exemplary process of forming the plurality of reference patterns 134P, as illustrated in FIG. 3, a third mask layer may be formed on the second mask layer 138 (see FIG. 2) by a photolithography process, and a second mask pattern 138P and a first material layer pattern 136P may be formed on the preliminary reference layer 134 by sequentially etching the second mask layer 138 and the first material layer 136 using the third mask layer as an etch mask.

The third mask layer may be a photoresist pattern. Also, the second mask pattern 138P and the first material layer pattern 136P may each include a plurality of line patterns that extend along a first direction (an X direction of FIG. 3) parallel to a top of the substrate 110 on the preliminary reference pattern layer 134.

Subsequently, as illustrated in FIG. 4, the plurality of reference patterns 134P may be formed by etching the preliminary reference pattern layer 134 with the second mask pattern 138P and the first material layer pattern 136P as etch masks.

In the main pattern region MR, the plurality of reference patterns 134P may be arranged at the first pitch P1 along the first direction (the X direction) parallel to the top of the substrate 110 on the first mask layer 132. A width of each of the plurality of reference patterns 134P and an interval between adjacent reference patterns 134P may be selected depending on the kind of a desired feature pattern 120P and the kind and design of a semiconductor device including the feature pattern 120P. In some implementations, when a minimum feature size of a semiconductor device is 1 F, a width of each of the plurality of reference patterns 134P may be about 1 F, and an interval (or a distance) between two adjacent reference patterns 134P among the plurality of reference patterns 134P may be about 3 F. Therefore, the plurality of reference patterns 134P may be arranged at the first pitch P1 of about 4 F. In some implementations, a width of each of the plurality of reference patterns 134P may be about 1 F, and an interval between two adjacent reference patterns 134P among the plurality of reference patterns 134P may be more than about 3 F. In some implementations, a width of each of the plurality of reference patterns 134P may be about 1 F, and an interval between two adjacent reference patterns 134P among the plurality of reference patterns 134P may be less than about 3 F.

In the edge region ER, the plurality of reference patterns 134P may be formed to have a width greater than that of each of the plurality of reference patterns 134P in the main pattern region MR.

Figure 5:
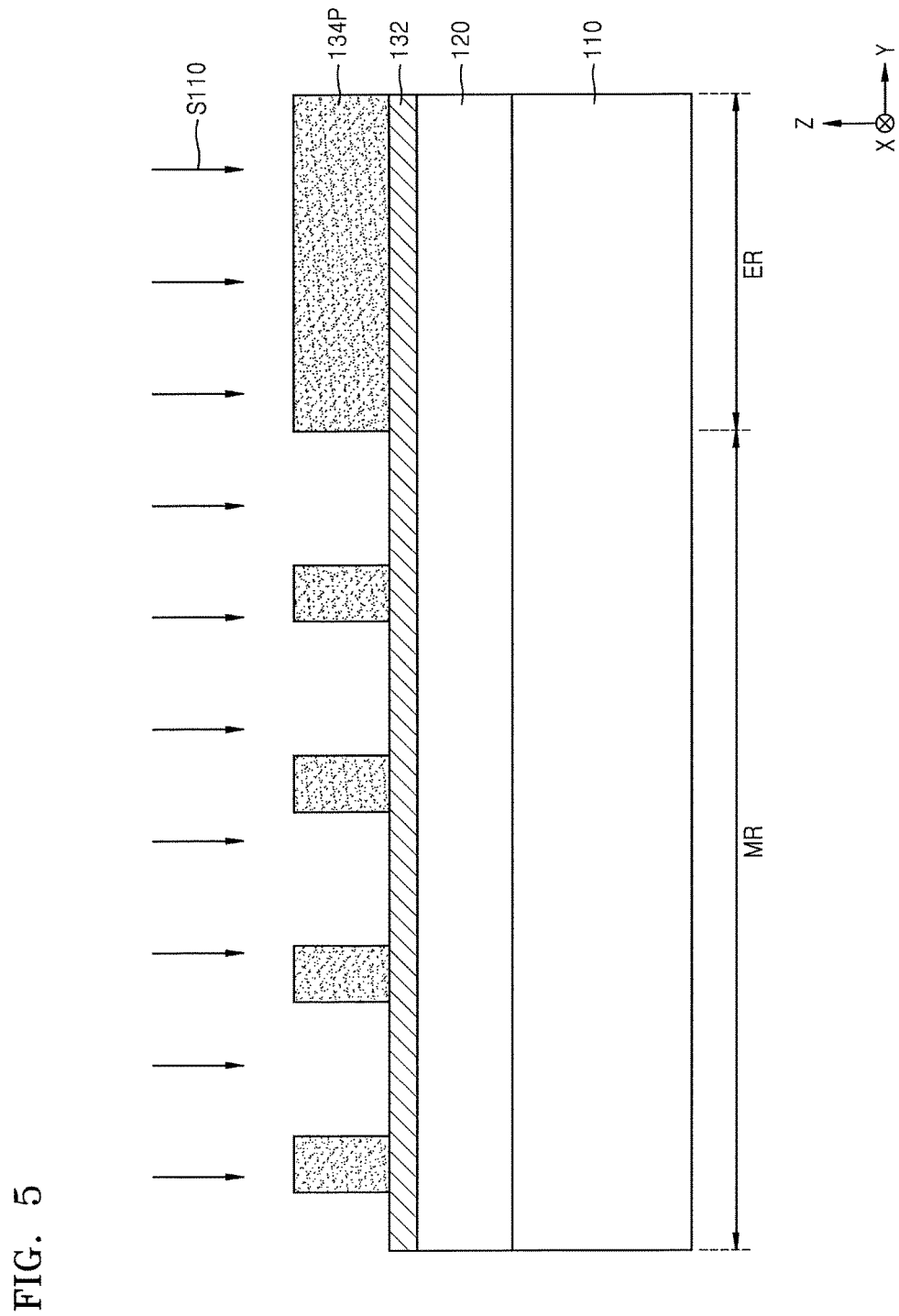

Referring to FIGS. 1 and 5, in operation S30, a surface treatment (S110) may be performed on the substrate 110 on which the plurality of reference patterns 134P are formed, in order to provide the plurality of reference patterns 134P with a hydrophilic surface.

The surface treatment (S110) may include a plasma treatment process, an ion implantation process, an ultraviolet (UV) irradiation process, an ozone vapor process, a wet spray process, and/or the like.

When the surface treatment S110 includes a plasma treatment process, the kind of source gas applied to the plasma treatment process, the temperature at which the plasma treatment process is performed, and/or the time during which the plasma treatment process is performed may be appropriately selected so as to sufficiently obtain a hydrophilic surface suitable for a side wall and a top of each of the plurality of reference patterns 134P and in order for an exposed top of each of the reference patterns 134P and an exposed top of the first mask layer 132 to not be damaged by plasma. For example, the plasma treatment process may be performed on the substrate 110 using at least one of argon (Ar), nitrogen ($N_2$), HBr, and oxygen ($O_2$) as a source gas. The plasma treatment process may be performed for several seconds to several minutes at a temperature of about 10° C. to about 200° C.

When the surface treatment (S110) includes a wet spray process, the wet spray process may include spraying an acidic solution containing, for example, $H_2SO_4$ and $H_2O_2$ in a predetermined ratio onto the plurality of reference patterns 134P and the first mask layer 132.

In some implementations, two processes selected from among the plasma treatment process, the ion implantation process, the UV irradiation process, the ozone vapor process, and the wet spray process may be sequentially performed.

Figure 6:
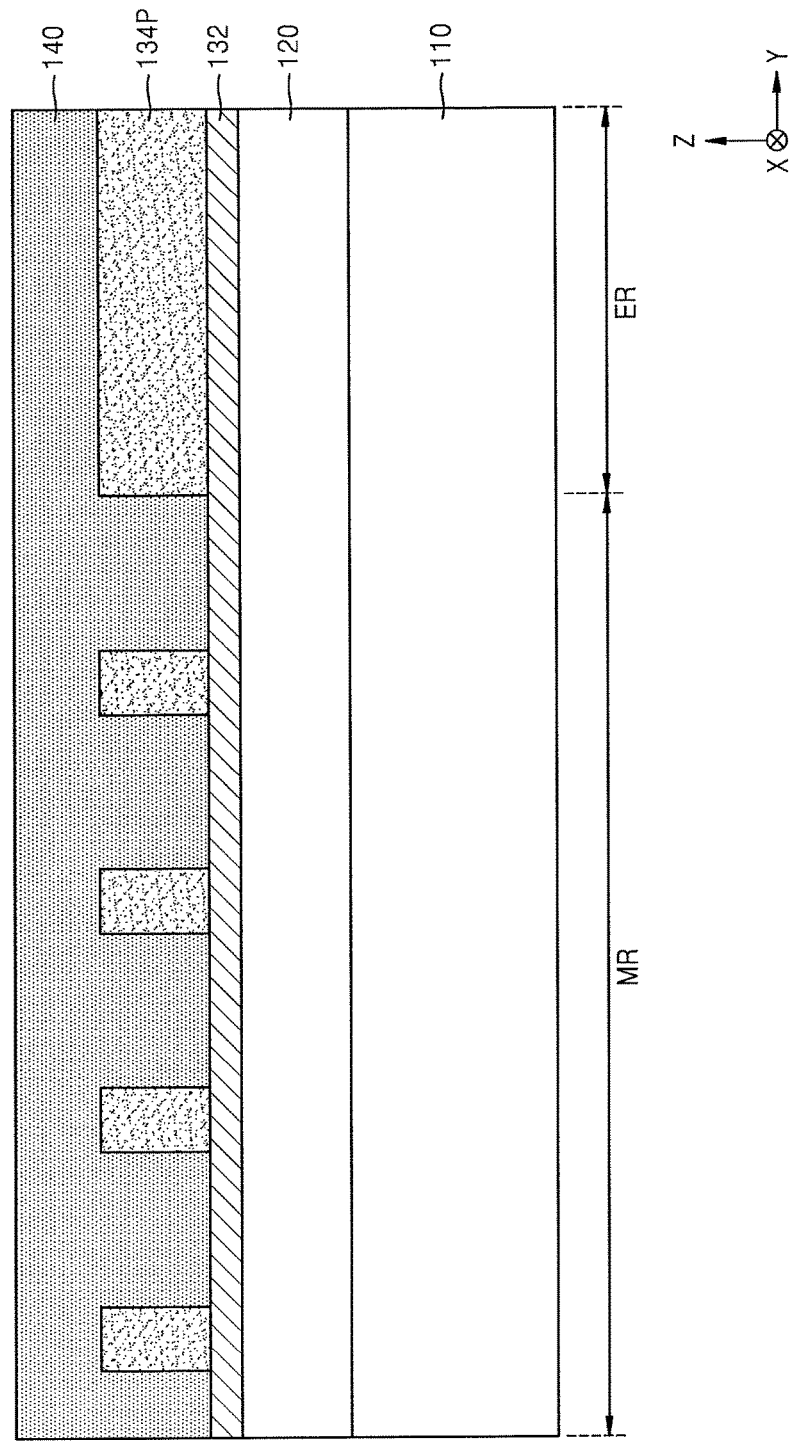

Referring to FIGS. 1 and 6, in operation S40, an organic coating layer 140 including an organic compound having hydrophilicity may be formed on the plurality of reference patterns 134P.

The organic compound may include an aliphatic or aromatic hydrocarbon compound including a hydrophilic functional group. For example, the organic compound may include a polymer material including oxygen (O), nitrogen (N), sulfur (S), a halogen atom, or the like. Examples of the hydrophilic functional group may include a hydroxyl group, an alkoxy group, a nitro group, a cyano group, an amino group, an azido group, an amidino group, a hydrazino group, a hydrazono group, a carbonyl group, a carbamyl group, a thiol group, an allylamine group, an ether group, an ester group, a carboxyl group, a sulfonic acid group, a trimethoxy silane ($—Si(OCH_3)_3$) group, a trichlorosilane ($—SiCl3$) group, etc., as examples.

The molecular weight of the organic compound may be appropriately selected based on a thickness of an organic liner 140L which is to be formed in a subsequent process. For example, the organic compound may have a molecular weight of about 300 g/mol to about 30,000 g/mol.

In some implementations, the organic compound may include a C5-C50 aliphatic hydrocarbon compound of, a portion of which is substituted with the hydrophilic functional group, or derivatives thereof. Here, the term "C5-C50 aliphatic hydrocarbon compound" denotes a chain-type hydrocarbon including five to fifty carbon atoms.

In other implementations, the organic compound may include a C5-C50 aromatic hydrocarbon compound, a portion of which is substituted with the hydrophilic functional group, or derivatives thereof. Here, the term "C5-C50 aromatic hydrocarbon compound denotes a cyclic aromatic hydrocarbon including five to fifty carbon atoms.

The C5-C50 aliphatic hydrocarbon compound or the C5-C50 aromatic hydrocarbon compound may be substituted with, for example, a substituent group selected from among an alkyl group, an alkenyl group, an alkynyl group, an aryl group, an arylalkyl group, an alkoxide group, a heteroalkyl group, a heteroarylalkyl group, a cycloalkyl group, a cycloalkenyl group, a cycloalkynyl group, a heterocycloalkyl group, and a combination thereof and may be a hydrocarbon compound including five to fifty carbon atoms. For example, the C5-C50 aliphatic hydrocarbon compound or the C5-C50 aromatic hydrocarbon compound of may be substituted with an alkyl group such as methyl, ethyl, ethynyl, normal propyl (n-propyl), isopropyl, n-butyl, isobutyl, secondary butyl (sec-butyl), tertiary butyl (t-butyl), butenyl, isobutenyl, butynyl, or n-pentyl, a cycloalkyl group such as cyclohexyl, cyclopentyl, or cyclopropyl, or an aryl or arylalkyl group such as phenyl, naphthyl, anthracenyl, phenanthrenyl, or fluorenyl.

In some implementation, the organic compound may include a polymer including a repeating group that is a C5-C50 aliphatic hydrocarbon compound, a portion of which is substituted with a hydrophilic functional group, or derivatives thereof, or a C5-C50 aromatic hydrocarbon compound, a portion of which is substituted with a hydrophilic functional group, or derivatives thereof.

For example, the organic compound may be or include a polymer including 2 to 150 repeating units of a C5-C50 aliphatic hydrocarbon compound, a portion of which is substituted with a hydrophilic functional group, or derivatives thereof, or a C5-C50 aromatic hydrocarbon compound a portion of which is substituted with a hydrophilic functional group, or derivatives thereof, the repeating units being connected to each other. For example, the organic compound may be or include a compound represented by the following Formula 1:

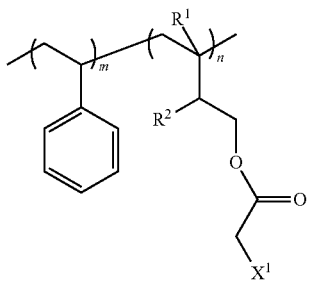

[Formula 1]

where $X^1$ denotes a hydrocarbon moiety including a hydrophilic functional group, $R^1$ and $R^2$ each denote a C1-C15 aliphatic hydrocarbon compound, m denotes an integer of 0 to 150, and n denotes an integer of 0 to 150. In Formula 1, case where both m and n are 0 is excluded.

The organic compound may include a polymer where 0 to 150 first repeating units are connected to 0 to 150 second repeating units. Each of the first repeating units may be a C5-C50 aliphatic hydrocarbon compound, a portion of which is substituted with a hydrophilic functional group, or derivatives thereof, or a C5-C50 aromatic hydrocarbon compound a portion of which is substituted with a hydrophilic functional group, or derivatives thereof, and each of the second repeating units may be a C5-C50 aliphatic hydrocarbon compound, a portion of which is substituted with a hydrophilic functional group, or derivatives thereof, or a C5-C50 aromatic hydrocarbon compound a portion of which is substituted with a hydrophilic functional group, or derivatives thereof. For example, the organic compound may include a compound represented by the following Formula 2:

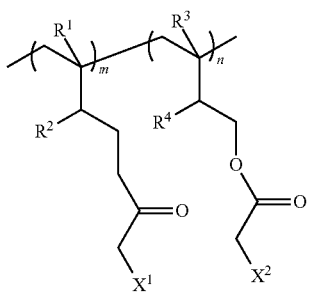

[Formula 2]

where $X^1$ and $X^2$ each denote a hydrocarbon moiety including a hydrophilic functional group, $R^1$, $R^2$ $R^3$, and $R^4$ each denote a c1-c15 aliphatic hydrocarbon compound, m denotes an integer of 0 to 150, and n denotes an integer of 0 to 150. In Formula 2, a case where both m and n are 0 is excluded.

The organic compound may be a copolymer that includes at least two polymer blocks or a block copolymer. For example, the organic compound may be a block copolymer that includes 0 to 150 first polymer blocks and second polymer blocks. In some implementations, the block copolymer may consist of a double (AB) copolymer including two kinds of block copolymers (A, B), a triple (ABA) copolymer including two kinds of block copolymers (A, B), a triple (ABC) copolymer including three kinds of block copolymers (A, B, C), or a multi-component block copolymer. One or more of the at least two polymer blocks may include a C5-C50 aliphatic hydrocarbon compound, a portion of which is substituted with a hydrophilic functional group, or derivatives thereof, or a C5-C50 aromatic hydrocarbon compound a portion of which is substituted with a hydrophilic functional group. For example, the organic compound may be or include a compound represented by the following Formula 3:

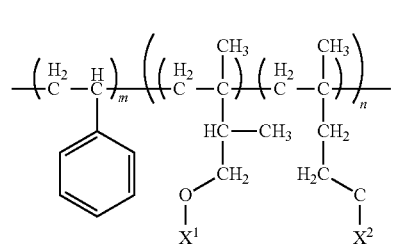

[Formula 3]

where $X^1$ and $X^2$ each denote a hydrocarbon moiety including a hydrophilic functional group, m denotes an integer of 0 to 150, and n denotes an integer of 0 to 150. In Formula 3, a case where both m and n are 0 is excluded.

A composition may be produced by dissolving the above-described organic compound in an organic solvent. The organic coating layer 140 may be formed, for example, by applying or coating the composition onto the plurality of reference patterns 134P and the first mask layer 132 through a spin coating process or a slit coating process. The organic coating layer 140 may be formed to a thickness of about 1,000 Å to about 5,000 Å to cover entire side walls and tops the reference patterns 134P.

The organic solvent may include a material having a good solubility with respect to a polymer material. Examples of the organic solvent may include an acetic acid-based solvent, an ester-based solvent, an acrylate-based solvent, and a ketone-based solvent. Examples of the organic solvent may include propylene glycol monomethyl ether acetate (PGMEA), polymethacrylate (PMA), and polyglycidyl methacrylate (PGMA). The materials may each be used as a single material or may be used as a combination of two or more.

Figure 7:
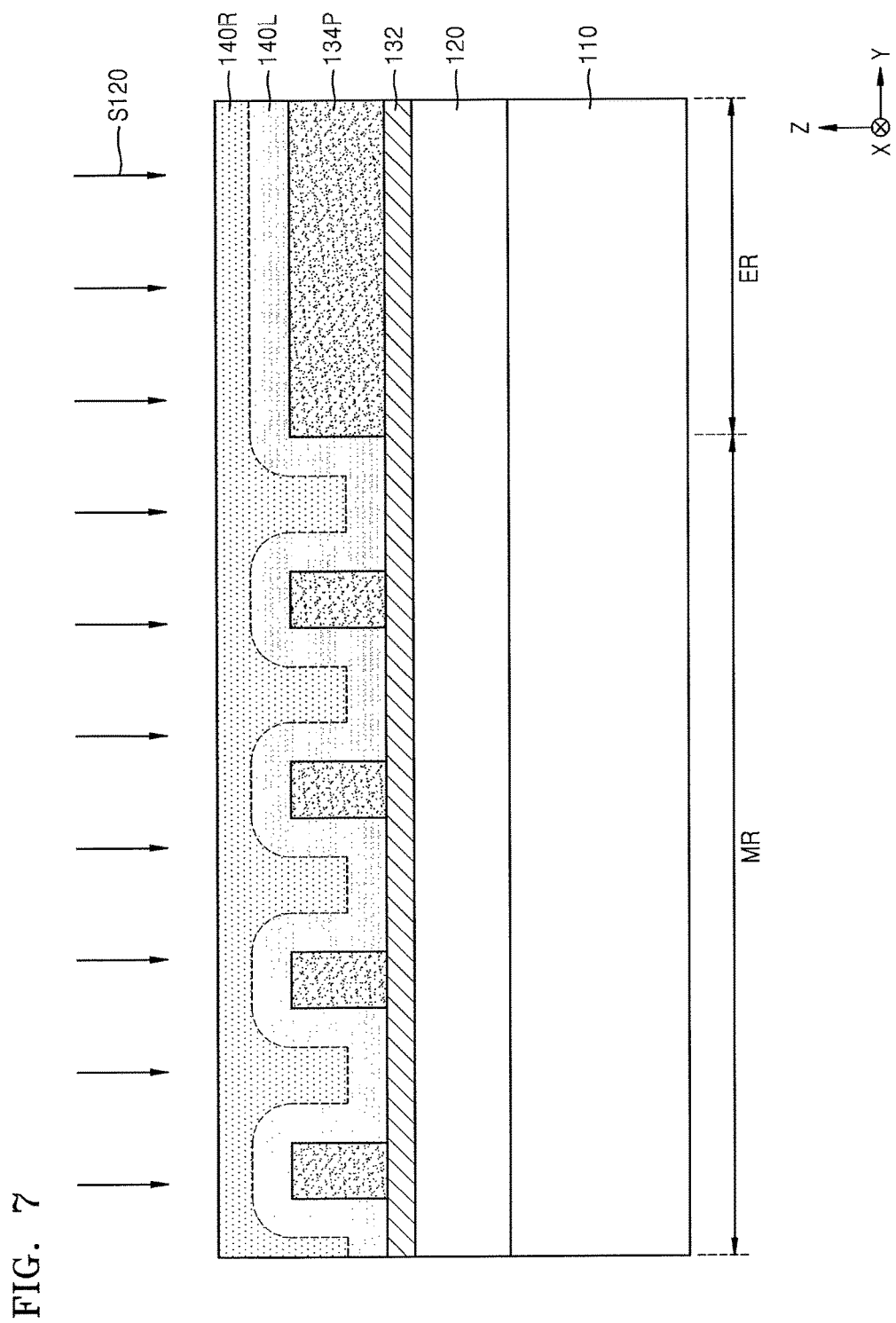
Figure 8:
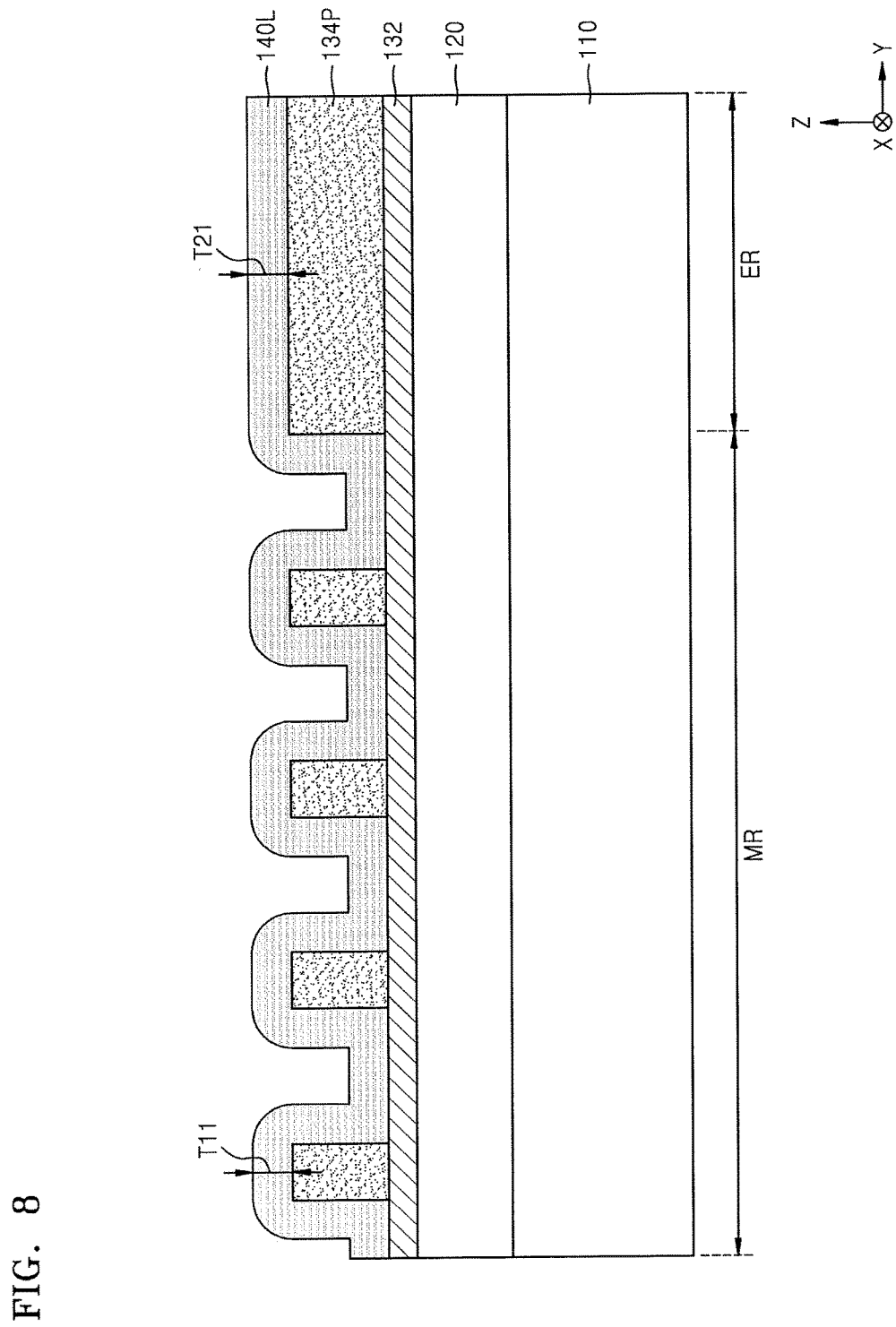
Figure 9:
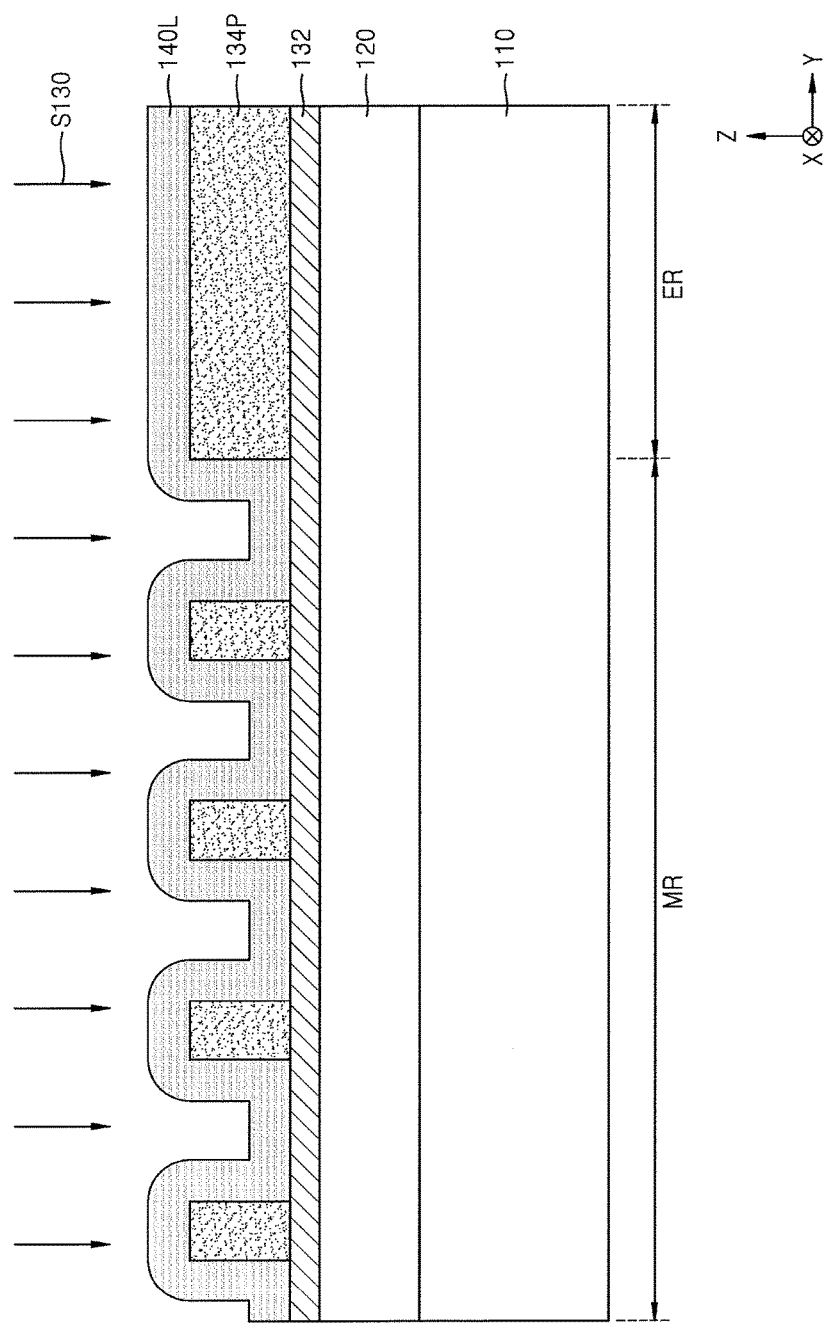

Referring to FIGS. 1, 7, and 8, in operation S50, the organic liner 140L may be conformally formed on a top of the first mask layer 132 and the side wall and top of each of the reference patterns 134P by performing a first baking treatment S120 on the organic coating layer 140.

In embodiments, the first baking treatment S120 may be performed for several tens of minutes to several hours at a temperature of about 50° C. to about 220° C. For example, the first baking treatment S120 may be performed on the substrate 110 on which the organic coating layer 140 is formed at a temperature of about 100° C. to about 150° C. The first baking treatment S120 may be performed, for example, at a temperature higher than a glass transition temperature (Tg) of the organic compound included in the organic coating layer 140 so as to obtain energy that is sufficient for the organic compound to be rearranged in the organic coating layer 140 during the first baking treatment S120.

The organic liner 140L may be conformally formed to a certain thickness on the top of the first mask layer 132 and the side wall and top of each of the reference patterns 134P. The organic liner 140L may be formed by self-aligning the organic compound having a hydrophilic functional group included in the organic coating layer 140 on a surface of each of the first mask layer 132 and the reference patterns 134P including a hydrophilic surface during the first baking treatment S120. For example, the organic compound may be an aliphatic hydrocarbon including a hydroxyl (—OH) group, and the organic liner 140L having a certain thickness may be formed by attaching the hydroxyl group to the hydrophilic surface of the reference patterns 134P or the first mask layer 132.

The organic liner 140L may include the organic compound conformally attached to the hydrophilic surface. Thus, a concentration of the organic compound included in the organic liner 140L may be higher than a concentration of the organic compound included in the organic coating layer 140. Also, a concentration of an organic compound included in an organic coating layer residual part 140R may be lower than the concentration of the organic compound included in the organic liner 140L.

Subsequently, the organic coating layer residual part 140R may be removed.

In some implementations, the organic coating layer residual part 140R may be selectively removed by coating a nonpolar solvent onto the substrate 110. The process of coating the nonpolar solvent may not remove the organic liner 140L.

The nonpolar solvent may include an aliphatic hydrocarbon such as benzene, toluene, or xylene; cyclohexane or cyclohexanone; a noncyclic or cyclic ether such as dimethyl ester, diethyl ester, ethylene glycol, propylene glycol, ethylene glycol monomethyl ether, ethylene glycol monoethyl ether, ethylene glycol methylethyl ether, diethylene glycol monomethyl ester, diethylene glycol monoethyl ester, diethylene glycol dimethyl ester, tetrahydrofuran, and dioxane; an acetate such as methyl acetate, ethyl acetate, propyl acetate, butyl acetate, methyl hydroxy acetate, ethyl hydroxyl acetate, methyl methoxy acetate, ethyl methoxy acetate, methyl ethoxy acetate, ethyl ethoxy acetate, propylene glycol methyl ester acetate, propylene glycol ethyl ester acetate, methyl cellosolve acetate, and ethyl cellosolve acetate; a propionate such as methyl 3-hydroxy propionate, ethyl 3-hydroxy propionate, methyl 2-methoxy propionate, ethyl 2-methoxy propionate, methyl 2-ethoxy propionate, ethyl 2-ethoxy propionate, methyl 3-methoxy propionate, ethyl 3-methoxy propionate, methyl 3-ethoxy propionate, ethyl 3-ethoxy propionate, propylene glycol methyl ester propionate, and propylene glycol ethyl ester propionate; a butyrate such as methyl-2-hydroxyisobutyrate, methyl α-methoxyisobutyrate, ethyl α-methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl α-hydroxyisobutyrate, ethyl α-hydroxyisobutyrate, isopropyl α-hydroxyisobutyrate, and butyl α-hydroxyisobutyrate; or a lactate such as methyl lactate, ethyl lactate, propyl lactate, and butyl lactate, or may include a combination thereof. For example, the nonpolar solvent may use n-butyl acetate or 2-heptanone.

As exemplarily illustrated in FIG. 8, the organic liner 140L in the main pattern region MR may have a first thickness T11 of about 10 Å to about 500 Å, and the organic liner 140L in the edge region ER may have a second thickness T21 of about 10 Å to about 500 Å. As described above, the organic compound included in the organic coating layer 140 (see FIG. 6) may be self-aligned to configure the organic liner 140L. Accordingly, a thickness of the organic liner 140L may be determined based on a length of the organic compound. Thus, the organic liner 140L may have the same thickness T11 and T21 in the main pattern region MR and the edge region ER. For example, the organic layer 140L on the reference pattern may have a same upper height along the vertical or z direction. A top surface of the organic layer 140 over the reference patterns 134P in the main pattern region and a top surface of the organic layer 140 over the reference patterns 134P in the edge region may be coplanar Referring to FIG. 9, second baking treatment S130 may be performed on the substrate 110 on which the organic liner 140L is formed.

The second baking treatment S130 may be performed for several minutes to several hours at a temperature of about 50° C. to about 220° C. For example, the second baking treatment S130 may be performed on the substrate 110 on which the organic liner 140L is formed at a temperature of about 100° C. to about 150° C. Through the second baking treatment S130, a surface roughness of the organic liner 140L may be improved (or the organic liner 140L may have a smoother top surface) or a surface strength of the organic liner 140L may be enhanced. Thus, the organic liner 140L may have an enhanced etching resistance. In some implementations, the second baking treatment S130 may be omitted.

Figure 10:
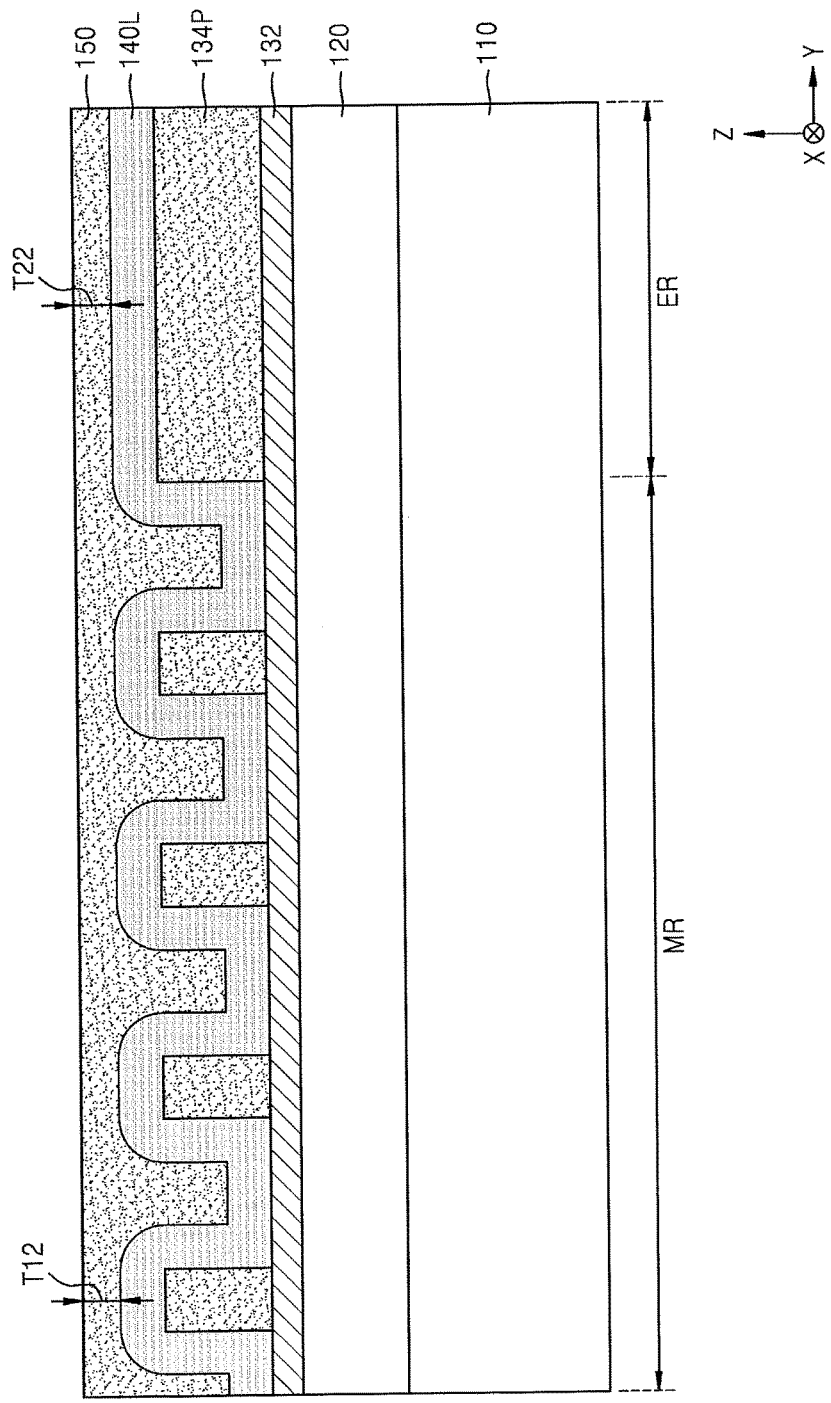
Figure 11:
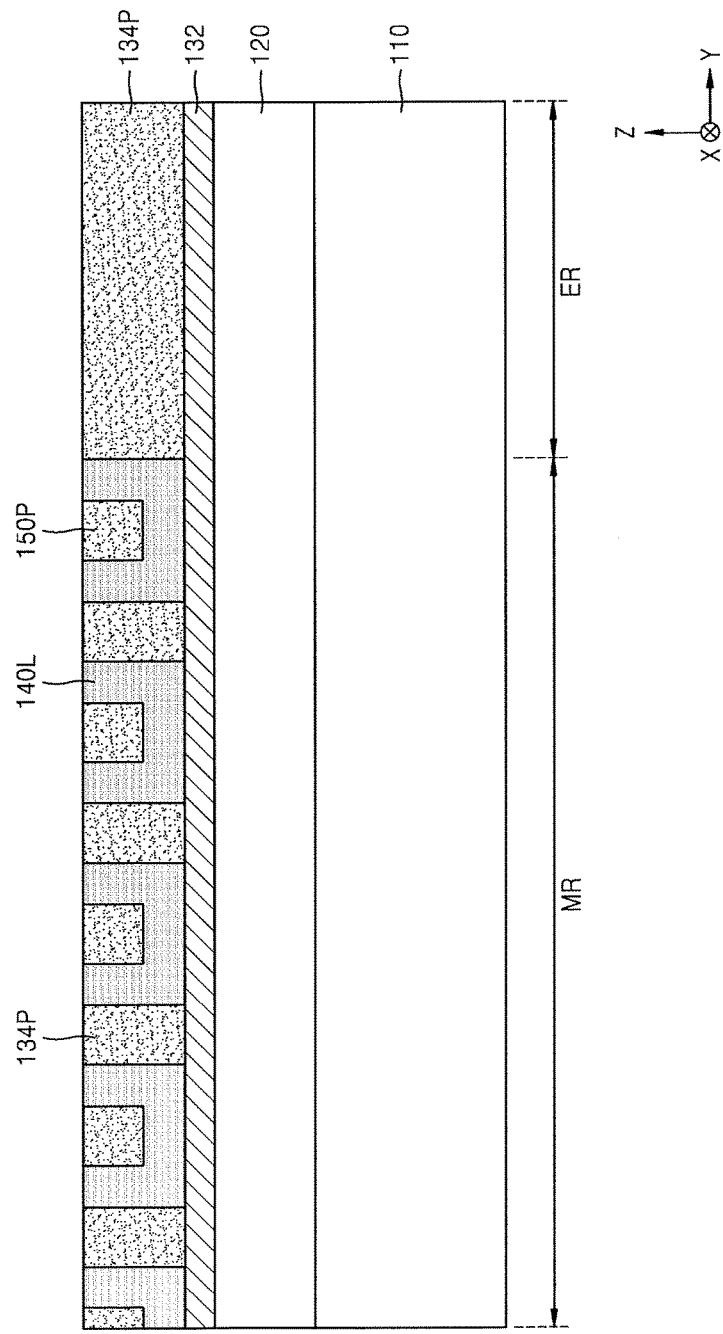

Referring to FIGS. 1, 10 and 11, in operation S60, a plurality of buried patterns 150P filling a space between side walls of the plurality of reference patterns 134P may be formed on the organic liner 140L.

In an exemplary process of forming the plurality of buried patterns 150P, as illustrated in FIG. 10, a buried layer 150 covering the space between the side walls of the plurality of reference patterns 134P may be formed on a top of the organic liner 140L. Subsequently, as illustrated in FIG. 11, the plurality of buried patterns 150P disposed between the plurality of reference patterns 134P may be formed by performing a planarization process on the buried layer 150.

The buried layer 150 may be formed of silicon oxide, silicon nitride, or silicon oxynitride through chemical vapor deposition (CVD), low pressure CVD, plasma enhanced CVD, metal organic CVD, atomic layer deposition (ALD), metal organic ALD, or the like.

The buried layer 150 may include a material having a sufficient etch selectivity with respect to the organic liner 140L and the first mask layer 132. For example, when the first mask layer 132 includes silicon oxynitride or silicon nitride, the buried layer 150 may include silicon oxide or silicon oxynitride. The buried layer 150 may include a material that is the same as or different from that of the reference patterns 134P. When the buried layer 150 includes a material different from that of the reference patterns 134P, the buried layer 150 may have an etching rate similar to that of the reference patterns 134P. For example, the plurality of reference patterns 134P may include silicon oxide, and the buried layer 150 may include silicon oxide.

As exemplarily illustrated in FIG. 10, the buried layer 150 disposed on a top of each of the reference patterns 134P in the main pattern region MR may have a third thickness T12, and the buried layer 150 disposed on the top of each of the reference patterns 134P in the edge region ER may have a fourth thickness T22 similar to the third thickness T12. For example, the buried layer 150 may have substantially uniform thicknesses T12 and T22 irrespective of a line width of each of the reference patterns 134P disposed under the buried layer 150.

Figure 14:
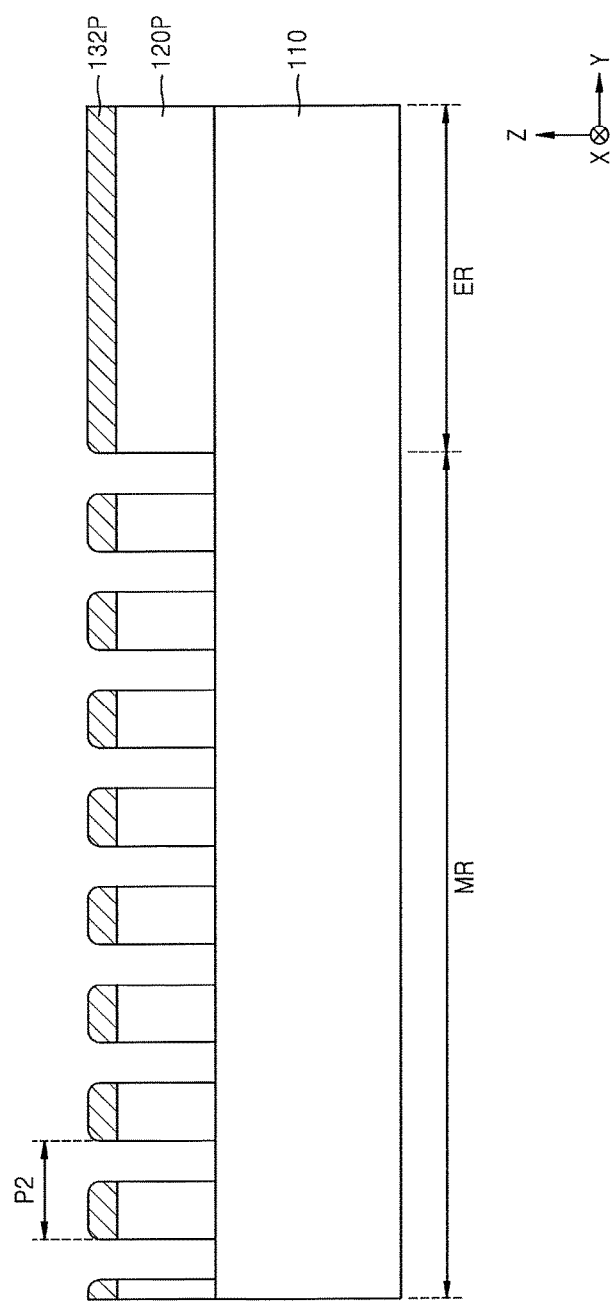

Generally, in a case of forming a buried layer including a carbon-containing layer through a spin coating process, a thickness of the buried layer may vary based on a line width of a line pattern disposed under the buried layer and/or a disposed position on a substrate. For example, the buried layer may have a relatively thin thickness in a main pattern region where line patterns having a narrow line width are disposed, and may have a relatively thick thickness T22 in an edge region where line patterns having a relatively wide line width are disposed. In this case, a top of the buried layer in the edge region may be on a level higher than the top of the buried layer in a main pattern region along a vertical direction (for example, a Z direction of FIG. 10). When the buried layer includes a carbon-containing layer, the buried layer may have a top level difference between the main pattern region and the edge region. The top level difference of the buried layer 150 may change depending on the height and width of each of the reference patterns, and depending on an aspect ratio of the reference patterns. For example, the buried layer may have the top level difference of up to 100 Å. An etching depth difference between the plurality of reference patterns may be caused by a non-flat top level of the buried layer in a subsequent process, and thus, an etching depth of the feature layer may not be precisely controlled in a subsequent process of etching the feature pattern (for example, a subsequent process such as illustrated in FIG. 14).

However, as exemplarily illustrated in FIG. 10, for example, when the buried layer 150 is formed of silicon oxide through a deposition process such as ALD or the like, the buried layer 150 having uniform thicknesses T12 and T22 along the vertical or z direction on an upper surface of the organic liner 140L, such that an upper surface of the buried layer 150 is coplanar, may be formed irrespective of a line width of the reference patterns 134P under the buried layer 150 and/or a location on the substrate 110. Therefore, a top level difference of the buried layer 150 that may be due to a location the substrate 110 or a line width of the reference patterns 134P under the buried layer 150, may be avoided.

In an exemplary process of planarizing the buried layer 150, an upper side of each of the buried layer 150 and the organic liner 140L may be removed by a certain thickness through a mechanical chemical polishing process, an etchback process, and/or the like until the top of each of the reference patterns 134P is exposed.

As exemplarily illustrated in FIG. 11, the organic liner 140L, which extends in a first direction (an X direction of FIG. 11), may be disposed on both side walls of each of the reference patterns 134P that extend in the first direction on the first mask layer 132. The buried patterns 150P that extend in the first direction may be disposed on a side wall of the organic liner 140L. Therefore, the plurality of reference patterns 134P, the organic liner 140L, the plurality of buried patterns 150P, and the organic liner 140L may be sequentially and repeatedly disposed along a second direction (a Y direction of FIG. 11) on the first mask layer 132.

As described above, the buried layer 150 may have a flat top level, accordingly all the tops of the plurality of reference patterns 134P, the plurality of buried patterns 150P, and the organic liner 140L may be disposed on the substantially same level after the planarization process. An etching depth of the feature layer 120 may be precisely controlled in a subsequent process of forming the feature pattern 120P.

Figure 12:
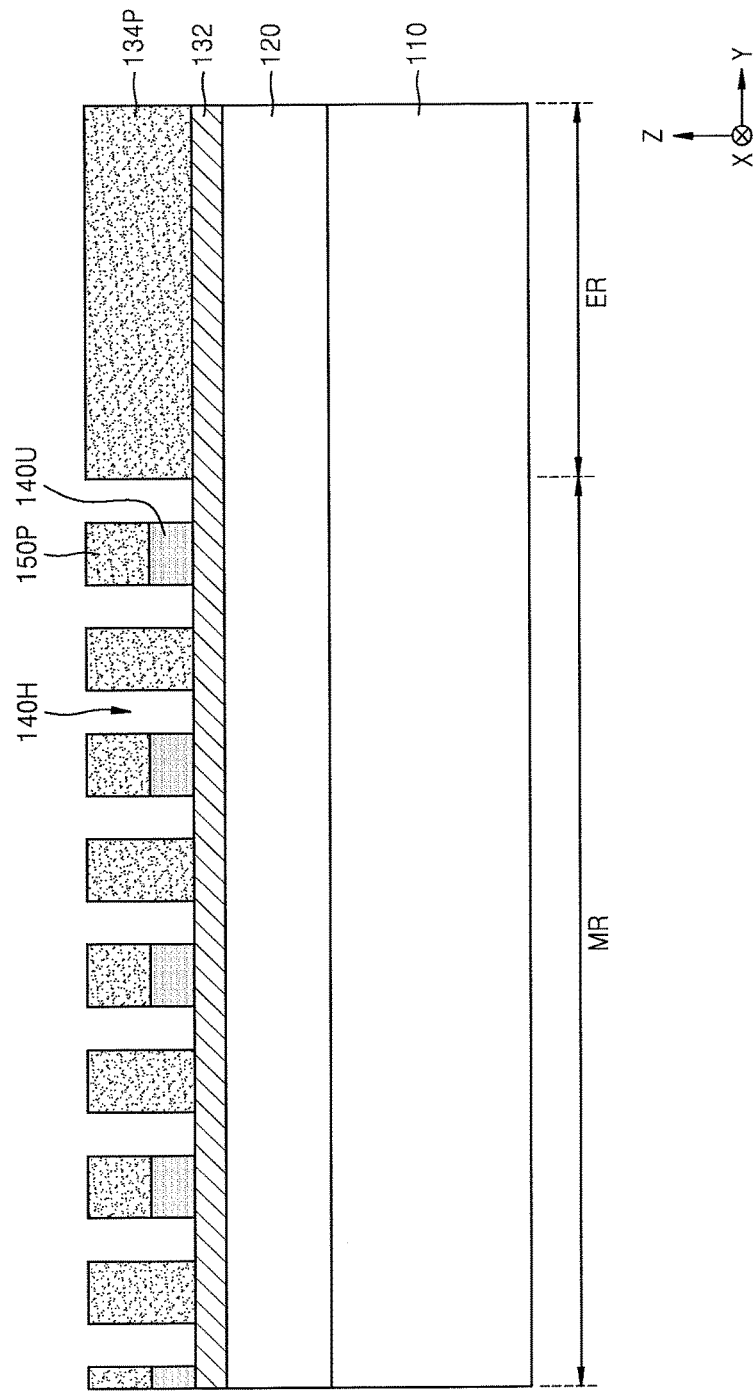

Referring to FIGS. 1 and 12, in operation S70, the organic liner 140L (see FIG. 11) exposed between the plurality of reference patterns 134P and the plurality of buried patterns 150P may be removed. An opening 140H may be formed at a position from which the organic liner 140L is removed, and the top of the first mask layer 132 may be exposed in a bottom of the opening 140H. A lower portion 140U of the organic liner 140L located under the plurality of buried patterns 150P may remain without being removed in the process of removing the organic liner 140L. The lower portion 140U of the organic liner 140L may be exposed in the bottom of the opening 140H.

The organic liner 140L may be removed by an anisotropic etching process such as an ion beam etching process, a reaction ion etching process, a plasma etching process, or a high density plasma etching process. For example, the anisotropic etching process may be a directional plasma process using nitrogen and hydrogen.

In the anisotropic etching process, a ratio of an etching rate of the organic liner 140L to an etching rate of the reference patterns 134P may be greater than about 5:1. For example, a ratio of an etching rate of the organic liner 140L to an etching rate of the reference patterns 134P may be more than about 10:1 or may be more than about 20:1. In the anisotropic etching process, a ratio of an etching rate of the organic liner 140L to an etching rate of the buried patterns 150P may be more than about 5:1. For example, a ratio of an etching rate of the organic liner 140L to an etching rate of the buried patterns 150P may be more than about 10:1 or may be more than about 20:1.

When the plurality of reference patterns 134P and the plurality of buried patterns 150P include an inorganic material such as silicon oxide or the like formed by an ALD process or the like, the plurality of reference patterns 134P and the plurality of buried patterns 150P may be relatively dense layers. On the other hand, the organic liner 140L including an organic compound may have a density relatively lower than that of the inorganic material or an etching resistance relatively weaker than that of the inorganic material. Therefore, the selective etching characteristic of the organic liner 140L may be considerably enhanced in the anisotropic etching process.

In a general double patterning process, a spacer or a liner is formed on both side walls of a reference pattern, and a buried pattern is formed on a side wall of the spacer or the liner. Subsequently, the reference pattern and the buried pattern remain, and by selectively removing the spacer or the liner, a fine pattern having a pitch less than a resolution limitation of photolithography is formed. Since the spacer or the liner should be conformally formed to have a uniform thickness on the side wall of the reference pattern, the spacer or the liner is generally formed of an inorganic material such as silicon oxide formed by the ALD process for example. Also, the reference pattern and the buried pattern are formed as a carbon-containing material layer such as an SOH material.

However, in the general double patterning process, it is not easy to perform a process where the reference pattern and the buried pattern each including, for example, the carbon-containing material layer, remain and where the spacer including, for example, an inorganic material, is selectively removed. This is because the carbon-containing material layer has an etching resistance relatively weaker than that of the spacer having a dense layer as described above. Therefore, a certain thickness of the reference pattern and the buried pattern may be undesirably removed in a process for removing only the spacer. For example, an etch selectivity of the carbon-containing material layer with respect to an inorganic material layer is slightly low, and after the spacer removing process, a deviation of thicknesses of the reference pattern and the buried pattern and a deviation of top levels of the reference pattern and the buried pattern may occur.

However, according to embodiments, as exemplarily illustrated in FIGS. 7 and 8, the plurality of reference patterns 134P may include an inorganic material having a dense layer, and the organic liner 140L including an organic compound may be conformally formed to have a uniform thickness on the side wall and upper surfaces of each of the reference patterns 134P. The plurality of buried patterns 150P may be formed to include an inorganic material having a dense layer. Therefore, in a process of leaving the plurality of reference patterns 134P and the plurality of buried patterns 150P including an inorganic material and selectively removing the spacer including an organic compound, an etch selectivity of the organic liner 140L with respect to the plurality of reference patterns 134P and the plurality of buried patterns 150P may be sufficiently high. Accordingly, an amount by which the plurality of reference patterns 134P and the plurality of buried patterns 150P are removed in the process of removing the organic liner 140L may be small, and thus, the plurality of reference patterns 134P and the plurality of buried patterns 150P may have top levels disposed on the substantially same plane, as shown in FIG. 12.

Figure 13:
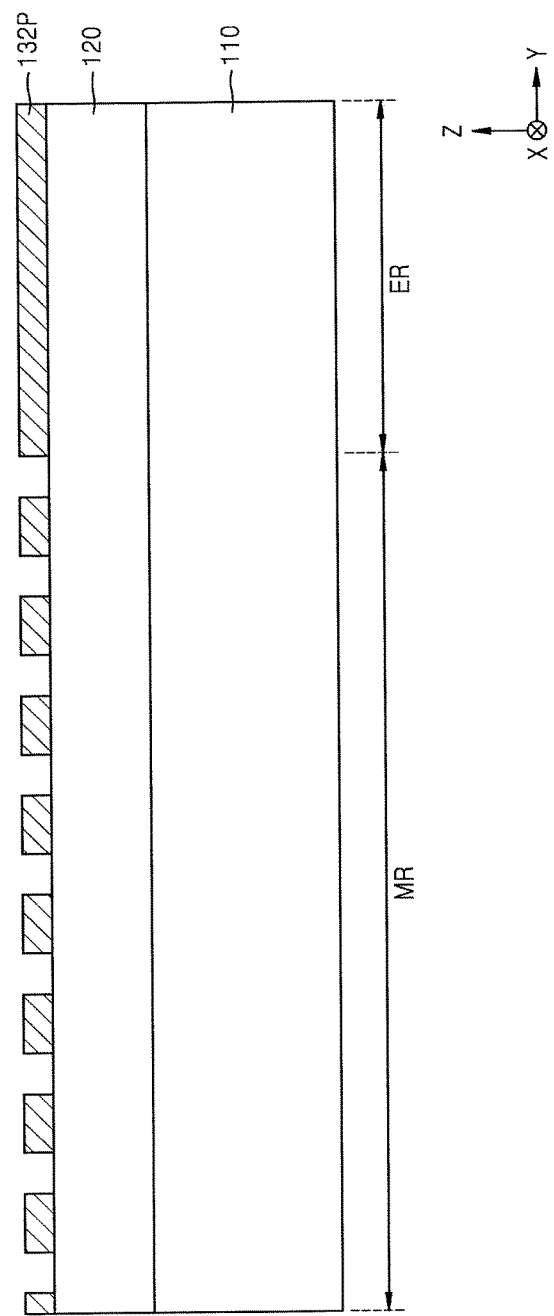

Referring to FIGS. 1, 13 and 14, in operation S80, the feature pattern 120P may be formed by etching the feature layer 120 with the plurality of reference patterns 134P and the plurality of buried patterns 150P as etch masks.

In an exemplary process of forming the feature pattern 120P, a first mask pattern 132P may be formed by etching the first mask layer 132 (see FIG. 12) with the plurality of reference patterns 134P and the plurality of buried patterns 150P as etch masks, and then, the feature pattern 120P may be formed by etching the feature layer 120 with the first mask pattern 132P as an etch mask.

As exemplarily illustrated in FIG. 14, the feature pattern 120P may include a plurality of line patterns arranged at a second pitch P2, which may be about half (½) of the first pitch P1 (see FIG. 4) at which the plurality of reference patterns 134P are arranged.

According to the above-described method of manufacturing the semiconductor device, the organic liner 140L may be conformally formed on the plurality of reference patterns 134P by self-aligning organic compounds having hydrophilicity on the side wall and top of each of the reference patterns 134P. The plurality of buried patterns 150P covering a space between the side walls of the plurality of reference patterns 134P on the organic liner 140L may be formed, and then, by selectively removing only the organic liner 140L, a fine pattern may be formed. The plurality of reference patterns 134P and the plurality of buried patterns 150P including an inorganic material may be used as a doubling pattern for patterning the feature layer disposed therebelow.

In DPT as generally practiced, a carbon-containing layer is used as the doubling pattern and an inorganic material is used as a spacer or a liner. Accordingly, the doubling pattern is consumed in a process of selectively removing the spacer, and for this reason, it is difficult to adjust a precise thickness of the doubling pattern and/or a lower feature pattern. Also, a buried layer is formed by using the carbon-containing layer for forming a buried pattern, for example, through a spin coating process, but a thickness of the buried layer may vary depending on a line width of a line pattern disposed under the buried layer and/or a disposed position in a substrate. For this reason, it may be difficult to precisely adjust an etching depth of each of the buried pattern and the reference pattern.

However, according to the above-described method of manufacturing the semiconductor device, the doubling pattern may hardly be etched in the process of selectively removing the organic liner 140L. Thereby, it is possible to precisely adjust a thickness of the doubling pattern and/or the feature pattern 120P thereunder. Also, when the buried layer 150 is formed by the ALD process or the like, for example, the buried layer 150 having a uniform thickness may be formed irrespective of a line width of each of the reference patterns 134P under the buried layer 150 and/or a disposed position in the substrate 110. Therefore, according to the manufacturing method, a CD variation of line patterns may be greatly reduced in a double patterning process.

FIGS. 15A to 19B illustrate plan views and cross-sectional views according to stages of a method of manufacturing a semiconductor device according to embodiments. FIGS. 15B, 16B, 17B, 18B and 19B illustrate cross-sectional views corresponding to line B-B' in FIGS. 15A, 16A, 17A, 18A and 19A, respectively. FIGS. 15A to 19B exemplarily illustrate a method of manufacturing a semiconductor device including a feature pattern 120PA having an island shape by using the DPT. In FIGS. 15A to 19B, like reference numerals illustrated in FIGS. 1 to 14 refer to like elements.

Figure 15A:
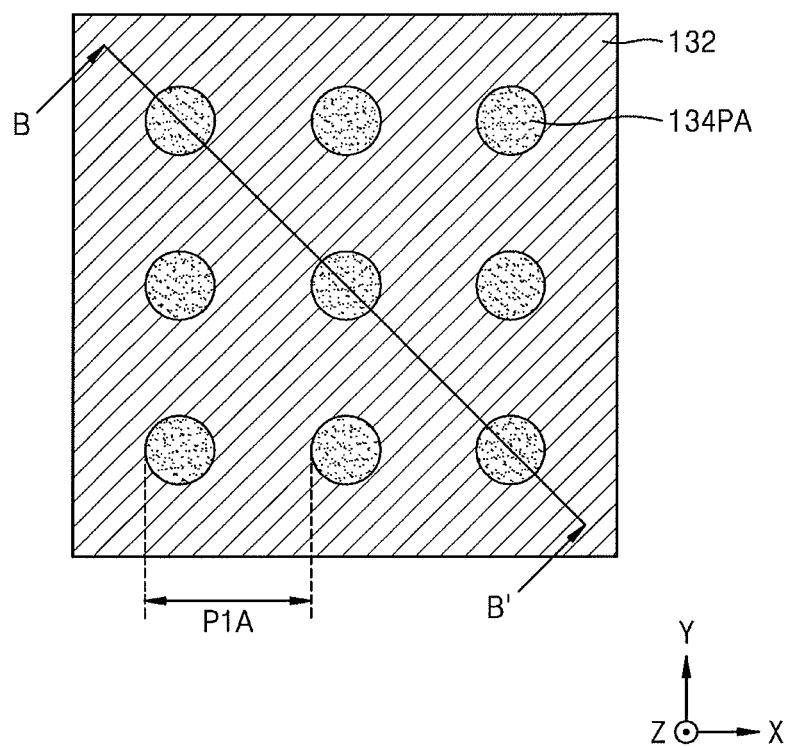
FIGS. 15A to 19B illustrate plan views and cross-sectional views according to stages of a method of manufacturing a semiconductor device according to embodiments.
Figure 15B:
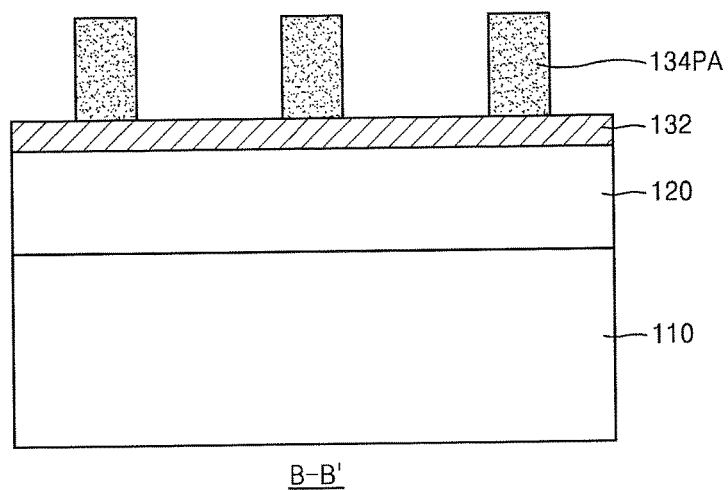

Referring to FIGS. 15A and 15B, a feature layer 120 and a first mask layer 132 may be sequentially formed on the substrate 110, and a plurality of reference patterns 134PA having an island shape may be formed on the first mask layer 132.

The detailed descriptions of the feature layer 120, the first mask layer 132, and the plurality of reference patterns 134P illustrated in FIGS. 1 to 4 may be applied to the feature layer 120, the first mask layer 132, and the plurality of reference patterns 134PA.

The plurality of reference patterns 134PA may be repeatedly disposed along a first direction (an X direction of FIG. 15A) and a second direction (a Y direction of FIG. 15B) parallel to a top of the substrate 110 on the first mask layer 132. The plurality of reference patterns 134PA may be arranged at a first pitch P1A along the first direction or the second direction.

The plurality of reference patterns 134PA may have various cross-sectional shapes such as a rectangular shape, a square shape, a diamond shape, an elliptical shape, etc. For example, as illustrated in FIG. 15A, the plurality of reference patterns 134PA may have a circular cross-sectional shape in a vertical direction.

Figure 16A:
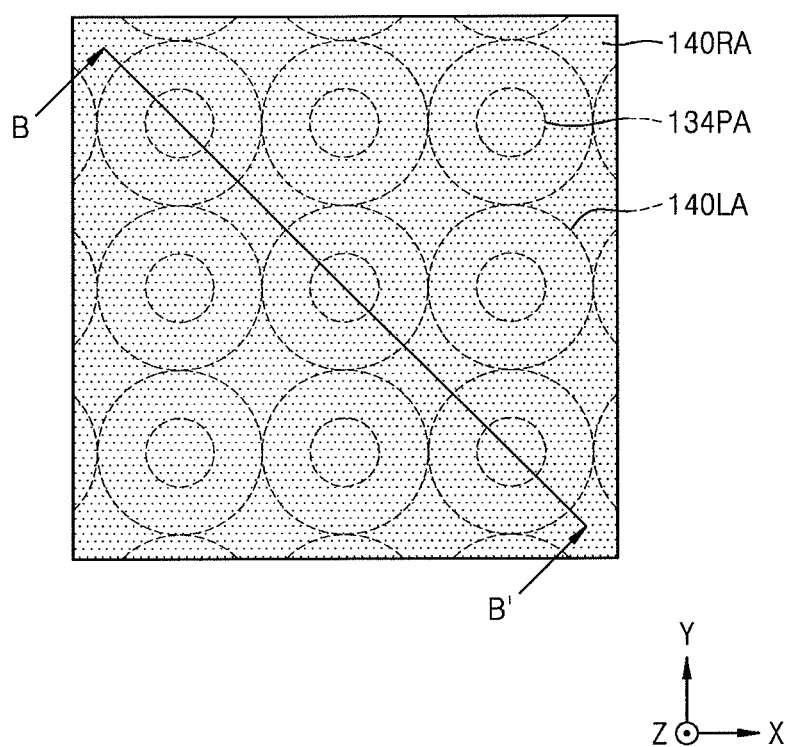
Figure 16B:
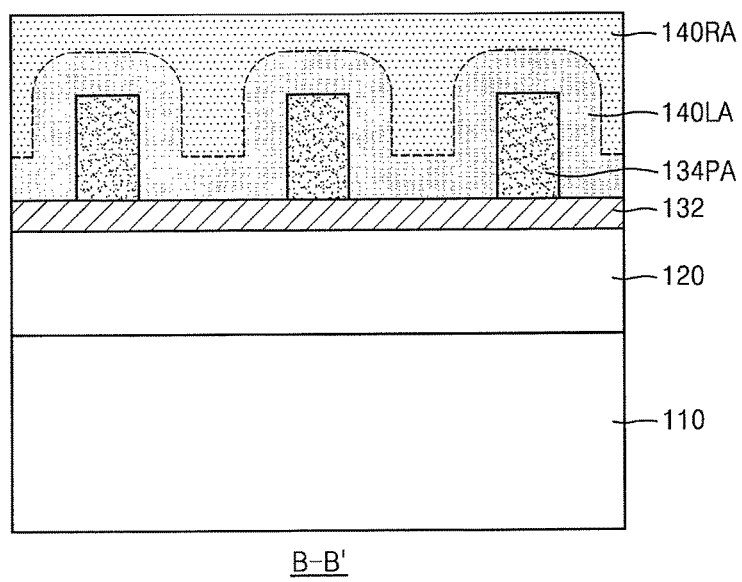

Referring to FIGS. 16A and 16B, a structure including an organic liner 140LA conformally covering the plurality of reference patterns 134PA and an organic coating layer remaining part 140RA on the organic liner 140LA may be formed.

The detailed descriptions of the processes described above with reference to FIGS. 1 and 5 to 7 may be applied to a process of forming the organic liner 140LA.

As exemplarily illustrated in FIG. 16B, the organic liner 140LA may be formed to have a uniform thickness on a side wall and a top of each of the reference patterns 134PA and a top of the first mask layer 132. The thickness of the organic liner 140LA may be varied depending on a molecular weight of an organic compound included in the organic liner 140LA or a length of the organic compound.

The thickness of the organic liner 140LA may be variously selected. As exemplarily illustrated in FIG. 16A, side walls of the organic liner 140LA disposed on side walls, facing each other, of two reference patterns 134PA adjacent to each other along a first direction (an X direction of FIG. 16A) among the plurality of reference patterns 134PA may contact each other. Also, side walls of the organic liner 140LA disposed on side walls, facing each other, of two reference patterns 134PA adjacent to each other along a second direction (a Y direction of FIG. 16B) among the plurality of reference patterns 134PA may contact each other. For example, the organic liner 140LA may be formed to have a thickness that is equal to one-half of an interval between two adjacent reference patterns 134PA in the X and Y directions.

Figure 17A:
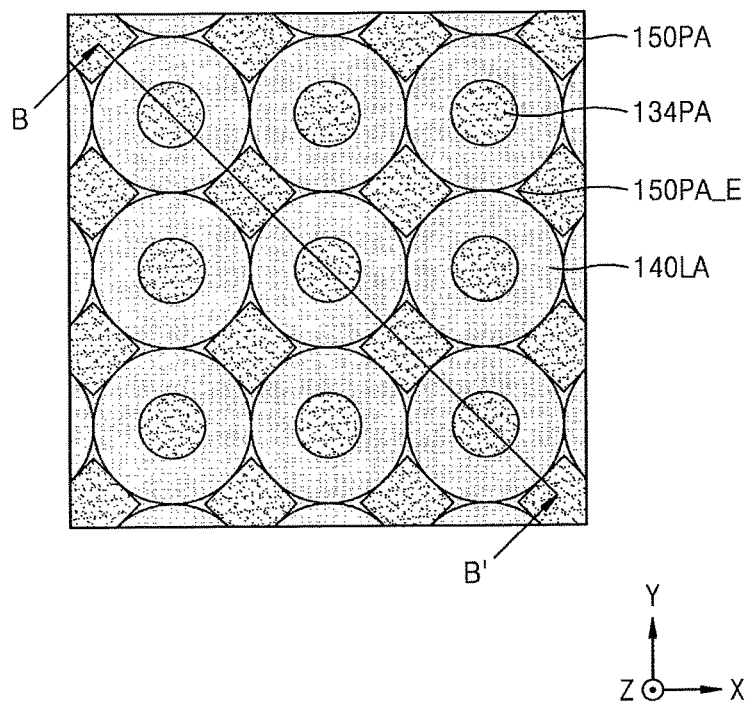
Figure 17B:
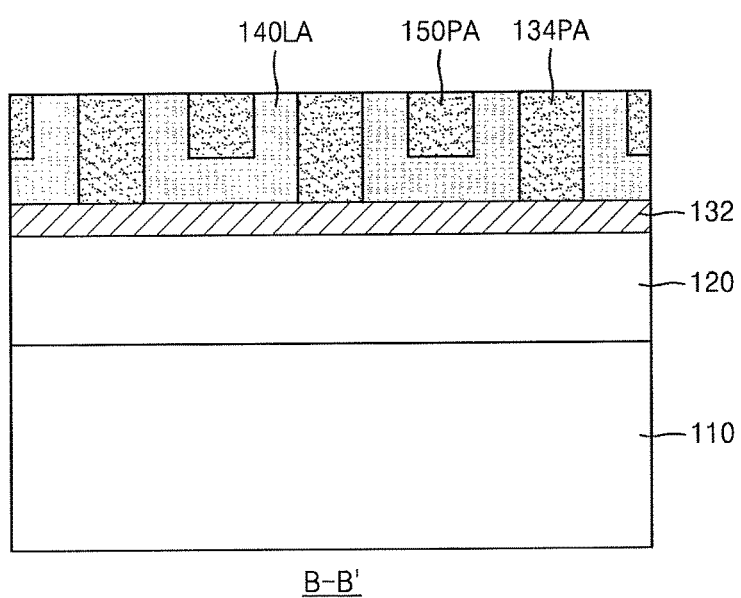

Referring to FIGS. 17A and 17B, a plurality of buried patterns 150PA covering a space between the side walls of the plurality of reference patterns 134PA on the organic liner 140L may be formed.

The detailed descriptions of the processes described above with reference to FIGS. 1 and 8 to 11 may be applied to a process of forming the plurality of buried patterns 150PA.

As exemplarily illustrated in FIG. 17A, the organic liner 140LA may be disposed between two reference patterns 134PA arranged adjacent to each other along a first direction (an X direction of FIG. 17A), and between two reference patterns 134PA arranged adjacent to each other along a second direction (a Y direction of FIG. 17A). Each of the plurality of buried patterns 150PA may be disposed between two reference patterns 134PA arranged adjacent to each other along a diagonal direction between the first direction and the second direction, and a side wall of each of the buried patterns 150PA may contact a side wall of the organic liner 140LA.

As exemplarily illustrated in FIG. 17A, a portion of the side wall of each of the buried patterns 150PA may contact a portion of a rounded side wall of the organic liner 140LA. The step coverage characteristic of the plurality of buried patterns 150PA may be changed depending on a material configuring the plurality of buried patterns 150PA or a process of forming the plurality of buried patterns 150PA, and the plurality of buried patterns 150PA may have various shapes depending on the step coverage characteristic of the plurality of buried patterns 150PA. As illustrated in FIG. 17A, an edge 150PA_E of each of the buried patterns 150PA may not contact the rounded side wall of the organic liner 140LA. In some implementations, the edge 150PA_E of each of the buried patterns 150PA may have a tapered shape and may contact the rounded side wall of the organic liner 140LA.

The plurality of reference patterns 134PA may have various cross-sectional shapes such as an ellipse, a circle, etc. As exemplarily illustrated in FIG. 17A, a vertical cross-sectional surface of each of the buried patterns 150PA may have a tetragonal cross-sectional shape or a diamond-shaped cross-sectional shape in a vertical direction.

Figure 18A:
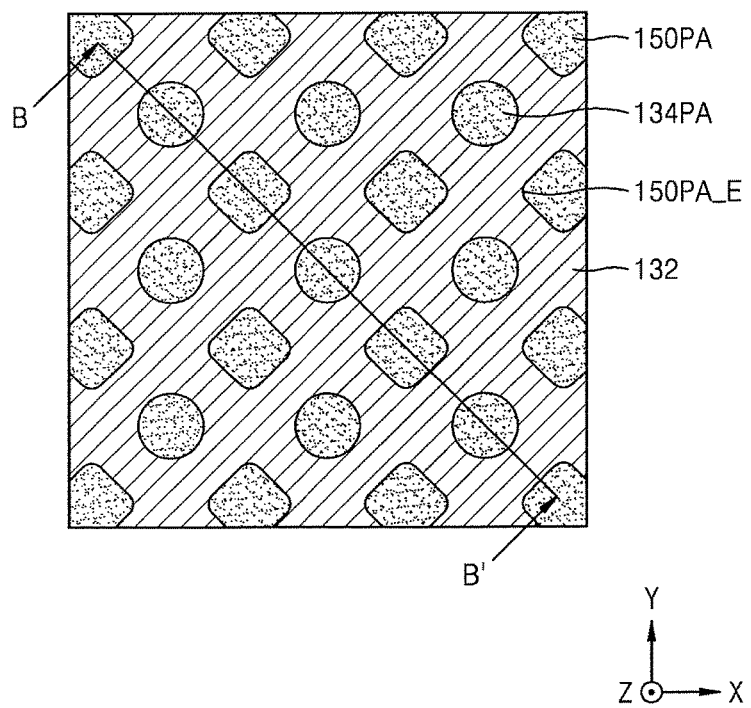
Figure 18B:
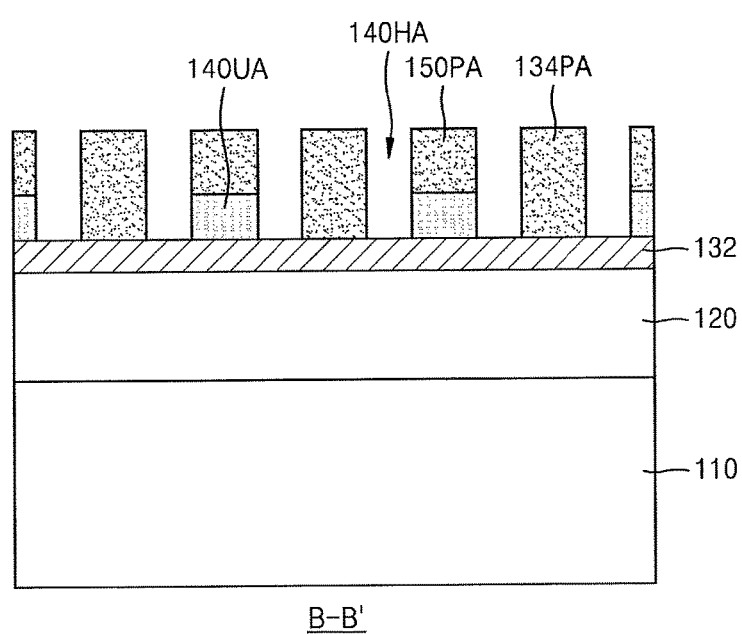

Referring to FIGS. 18A and 18B, the organic liner 140LA (see FIGS. 17A and 17B) exposed between the plurality of reference patterns 134PA and the plurality of buried patterns 150PA may be removed.

The detailed descriptions of the processes described above with reference to FIGS. 1 to 12 may be applied to a process of removing the organic liner 140LA.

As exemplarily illustrated in FIG. 18A, the edge 150PA_E of each of the buried patterns 150PA may also be consumed in the process of removing the organic liner 140LA and thus may have a rounded corner.

Figure 19A:
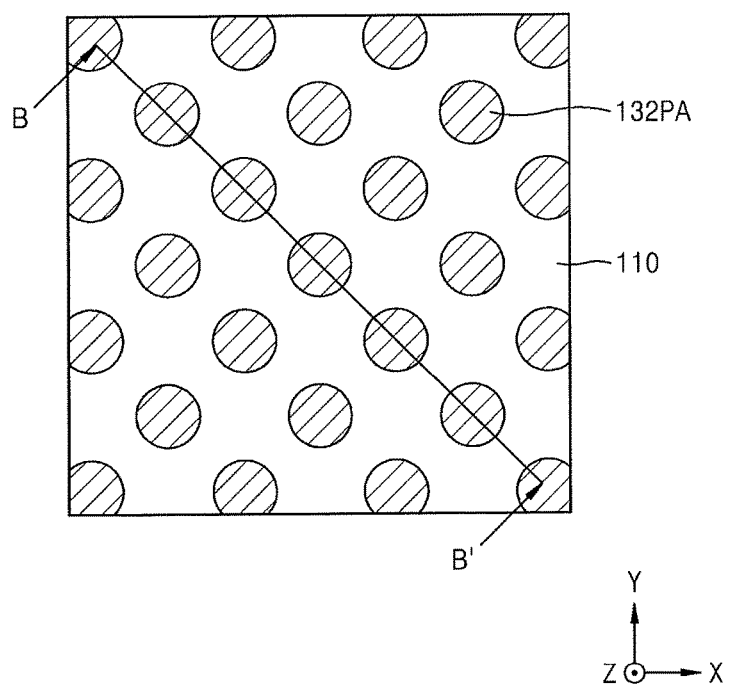
Figure 19B:
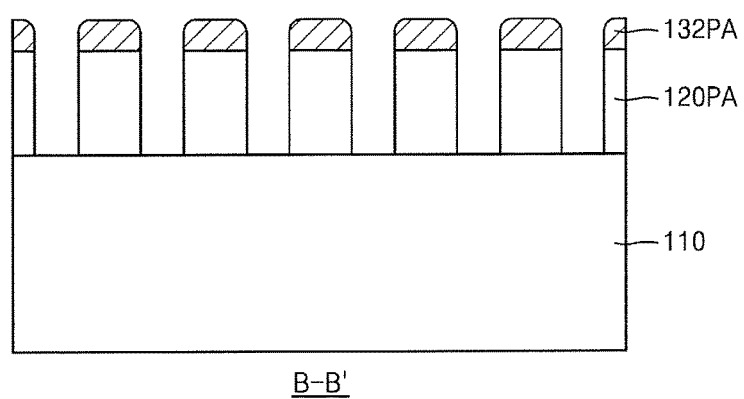

Referring to FIGS. 19A and 19B, a first mask pattern 132PA and a feature pattern 120PA may be formed by etching the first mask layer 132 (see FIG. 18B) and the feature layer 120 (see FIG. 18B) with the plurality of reference patterns 134PA (see FIG. 18A) and the plurality of buried patterns 150PA (see FIG. 18A) as etch masks.

The detailed descriptions of the processes described above with reference to FIGS. 1, 13 and 14 may be applied to a process of removing the first mask pattern 132PA and the feature pattern 120PA.

The edge 150PA_E (see FIG. 18A) of each of the buried patterns 150PA may also be consumed in the process of etching the first mask layer 132 and the feature layer 120, and thus, as exemplarily illustrated in FIG. 19A, the first mask pattern 132PA and the feature pattern 120PA under the plurality of buried patterns 150PA may each have a circle-shaped or ellipse-shaped vertical cross-sectional shape.

FIGS. 20 to 31 illustrate cross-sectional views according to stages of a method of manufacturing a semiconductor device according to embodiments. FIGS. 20 to 31 exemplarily illustrate a method of manufacturing a semiconductor device including a feature pattern 120PB having a line shape by using quadrature patterning technology (QPT). In FIGS. 20 to 31, like reference numerals illustrated in FIGS. 1 to 19B refer to like elements.

Figure 20:
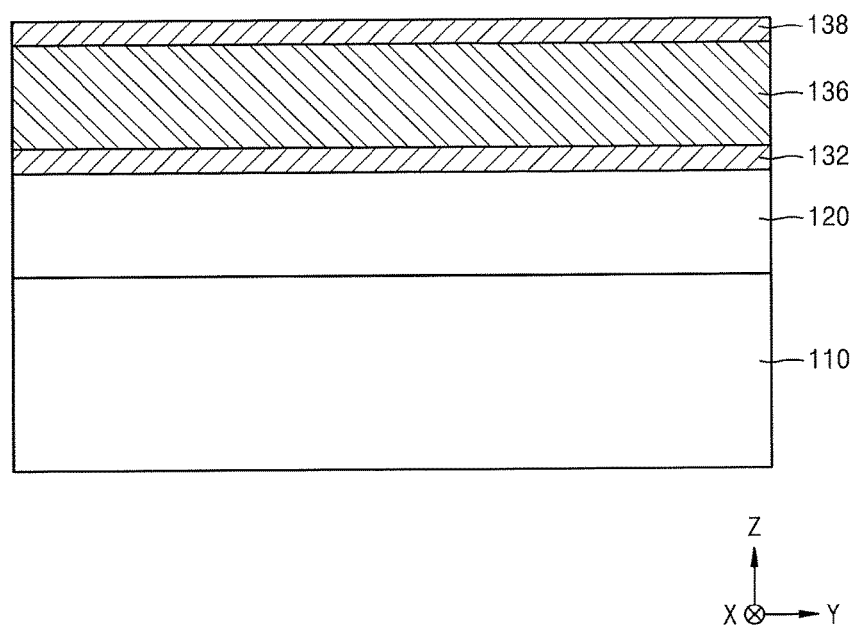
FIGS. 20 to 31 illustrate cross-sectional views according to stages of a method of manufacturing a semiconductor device according to embodiments.

Referring to FIG. 20, a feature layer 120, a first mask layer 132, a first material layer 136, and a second mask layer 138 may be sequentially formed on a substrate 110.

The detailed descriptions of the feature layer 120, the first mask layer 132, the first material layer 136, and the second mask layer 138 described above with reference to FIGS. 1 to 4 may be applied to the feature layer 120, the first mask layer 132, the first material layer 136, and the second mask layer 138 illustrated in FIG. 20.

Figure 21:
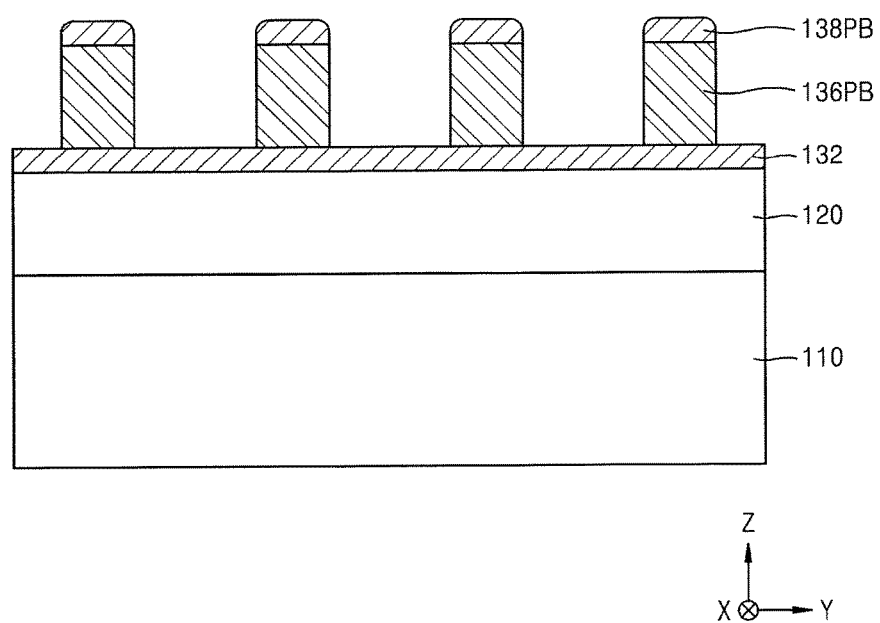

Referring to FIG. 21, a third mask may be formed on the second mask layer 138 by a photolithography process, and a second mask pattern 138PB may be formed by etching the second mask layer 138 using the third mask as an etch mask. Subsequently, a first material layer pattern 136PB may be formed by etching the first material layer 136 with the second mask pattern 138PB as an etch mask.

In embodiments, the first material layer pattern 136PB may include a plurality of line patterns which are repeatedly arranged at an interval of about 5 F to have a width of about 3 F.

Figure 22:
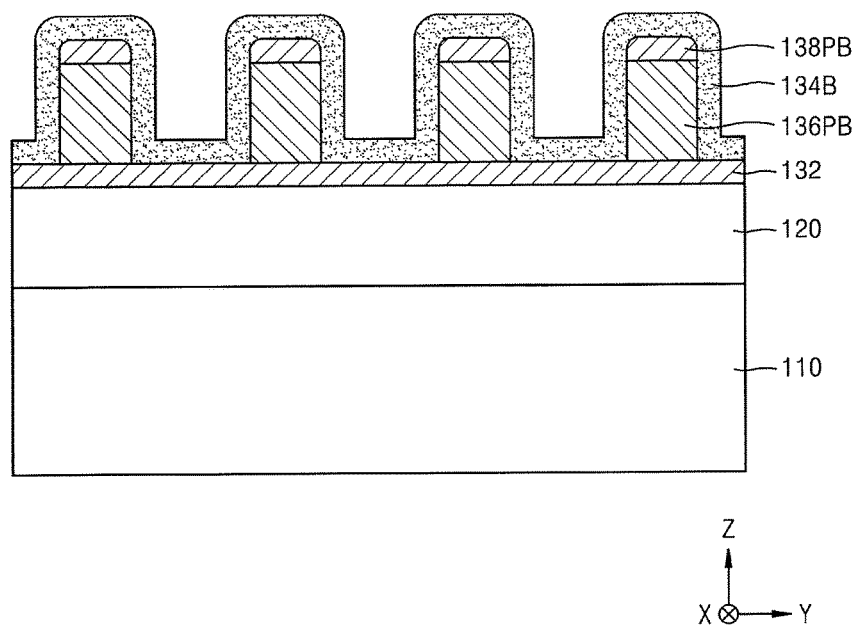

Referring to FIG. 22, a preliminary reference pattern layer 134B may be conformally formed on a side wall of the first material layer pattern 136PB, a side wall and a top of the second mask pattern 138PB, and a top of the first mask layer 132. For example, the preliminary reference pattern layer 134B may be formed of silicon oxide, silicon oxynitride, and/or the like by an ALD process. For example, the preliminary reference pattern layer 134B may have a thickness of about 1 F.

Figure 23:
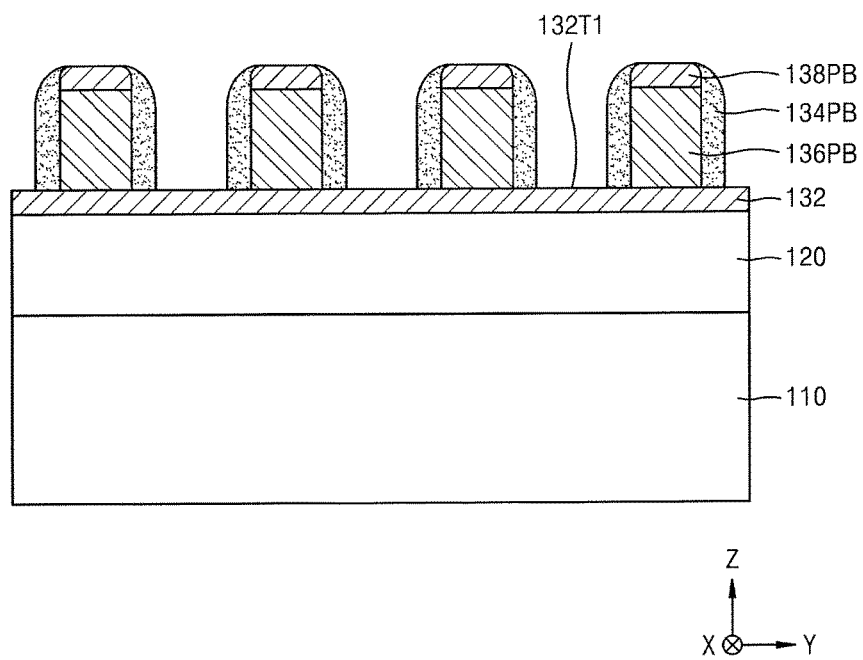

Referring to FIG. 23, a plurality of reference patterns 134PB may each be formed on both side walls of the first material layer pattern 136PB by performing an anisotropic etching process on the preliminary reference pattern layer 134B (see FIG. 22). In the anisotropic etching process, a first top 132T1 of the first mask layer 132 and a top of the second mask pattern 138PB may be exposed.

Figure 24:
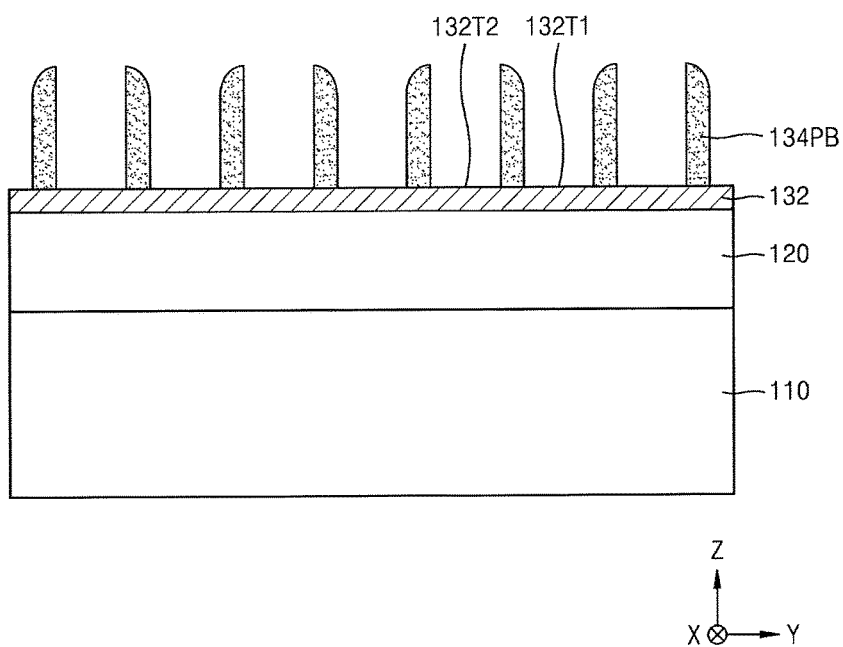

Referring to FIG. 24, the second mask pattern 138PB (see FIG. 23) and the first material layer pattern 136PB (see FIG. 23) may be removed. In the removing process, a second top 132T2 of the first mask layer 132 which has been covered by the first material layer pattern 136PB may be exposed.

A portion of an upper side of the first top 132T1 of the first mask layer 132 may be removed in the removing process, and thus, a recess may be formed in the first top 132T1 of the first mask layer 132.

Subsequently, a surface treatment may be performed on the substrate 110 on which the plurality of reference patterns 134PB are formed, such that a side wall of each of the reference patterns 134PB is provided to have a hydrophilic surface. The surface treatment may have a feature similar to that of the surface treatment S110 described above with reference to FIG. 5.

Figure 25:
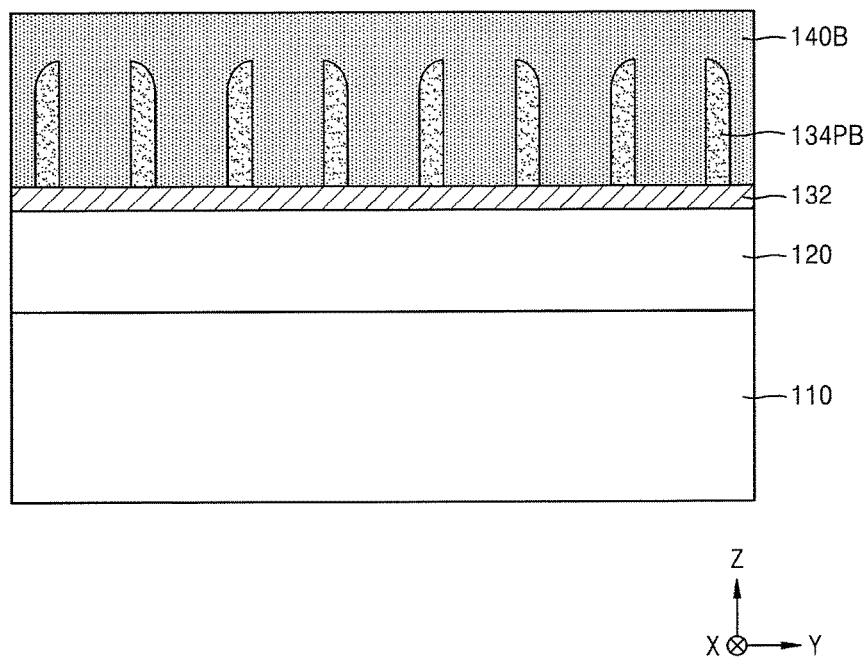

Referring to FIG. 25, an organic coating layer 140B including an organic compound having hydrophilicity may be formed on the first mask layer 132 and the plurality of reference patterns 134PB. The organic coating layer 140B and the organic compound may have features similar to those of the organic coating layer 140 and the organic compound described above with reference to FIG. 6.

Figure 26:
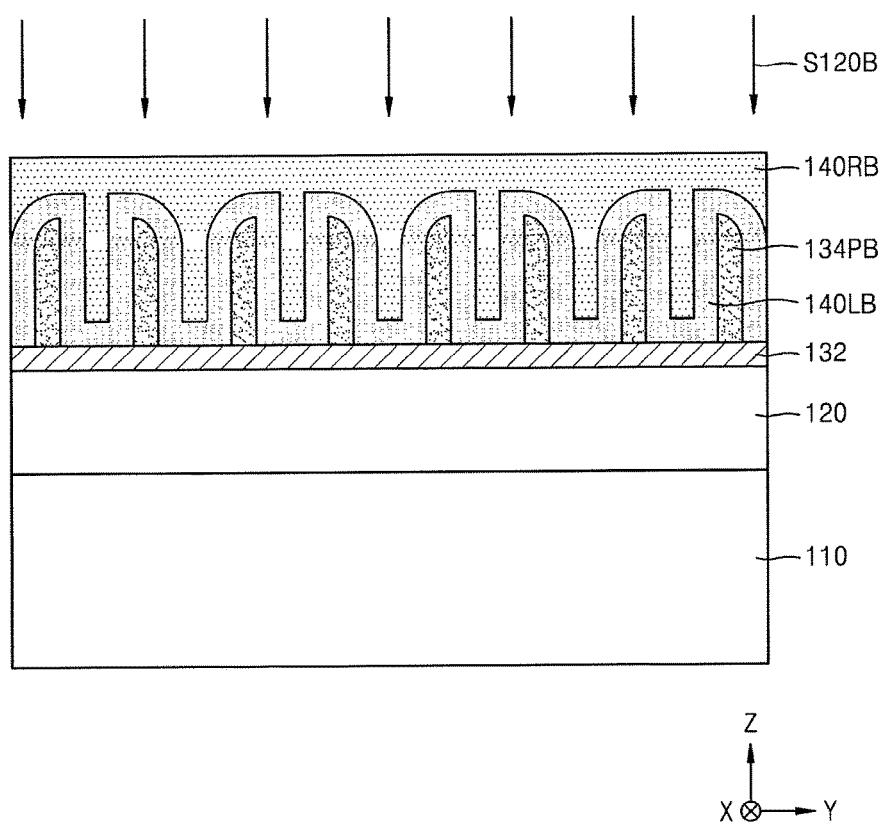

Referring to FIG. 26, an organic liner 140LB may be conformally formed on the side wall of each of the reference patterns 134PB by performing first baking treatment S120B on the organic coating layer 140B.

Figure 27:
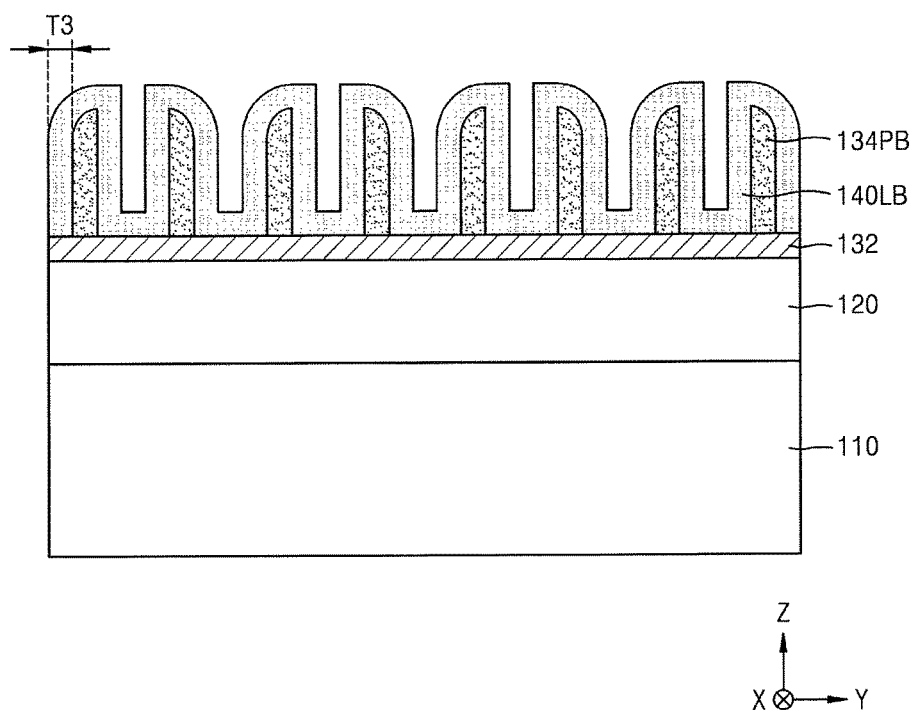

Referring to FIG. 27, an organic coating layer remaining part 140RB (see FIG. 26) may be removed. After the organic coating layer remaining part 140RB is removed, the organic liner 140LB may have a thickness T3 of about 1 F. The organic liner 140LB may be formed of the organic compound self-aligned on the hydrophilic surface of each of the reference patterns 134PB. The thickness T3 of the organic liner 140LB may be adjusted based on a molecular weight or a length of the organic compound. Therefore, in a QPT process having a micro pitch, the thickness T3 of the organic liner 140LB may be precisely adjusted by precisely adjusting the molecular weight or length of the organic compound.

Figure 28:
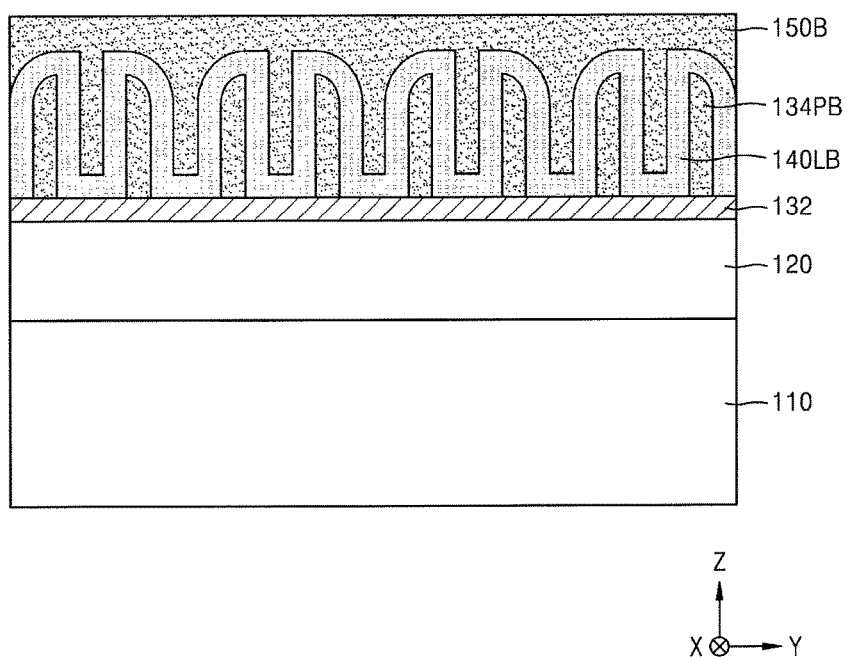

Referring to FIG. 28, a buried layer 150B covering a space between the side walls of the plurality of reference patterns 134PB may be formed on a top of the organic liner 140LB.

Figure 29:
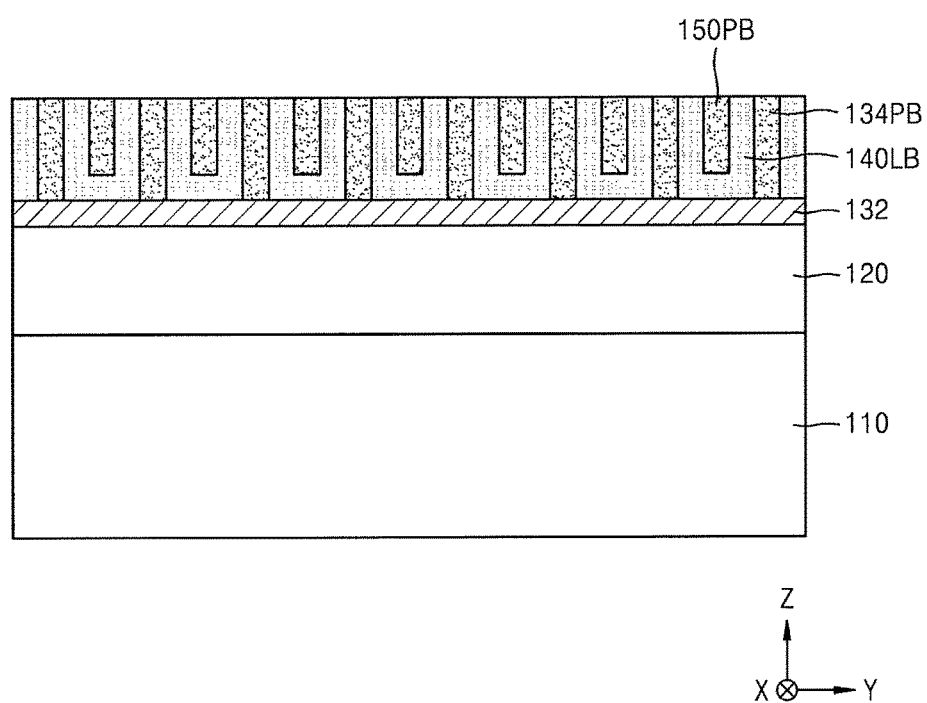

Referring to FIG. 29, a plurality of buried patterns 150PB disposed between the plurality of reference patterns 134PB may be formed by performing a planarization process on the buried layer 150B (see FIG. 28), the plurality of reference patterns 134PB, and the organic liner 140LB.

Figure 30:
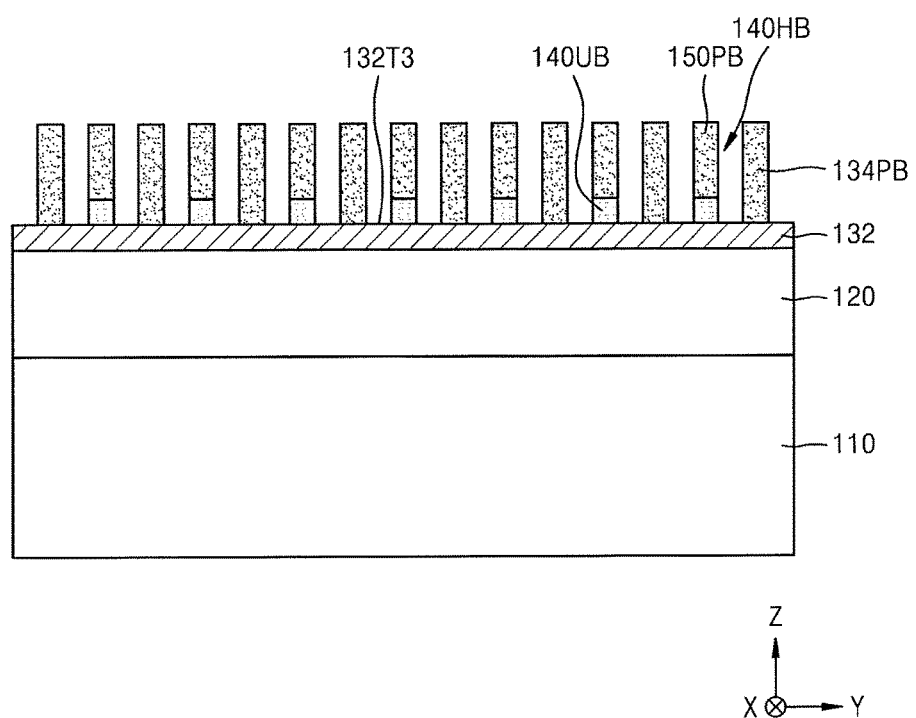

Referring to FIG. 30, the organic liner 140LB (see FIG. 11) exposed between the plurality of reference patterns 134PB and the plurality of buried patterns 150PB may be removed. An opening 140HB may be formed at a position from which the organic liner 140LB is removed, and a top 132T3 of the first mask layer 132 may be exposed in a bottom of the opening 140HB.

Figure 31:
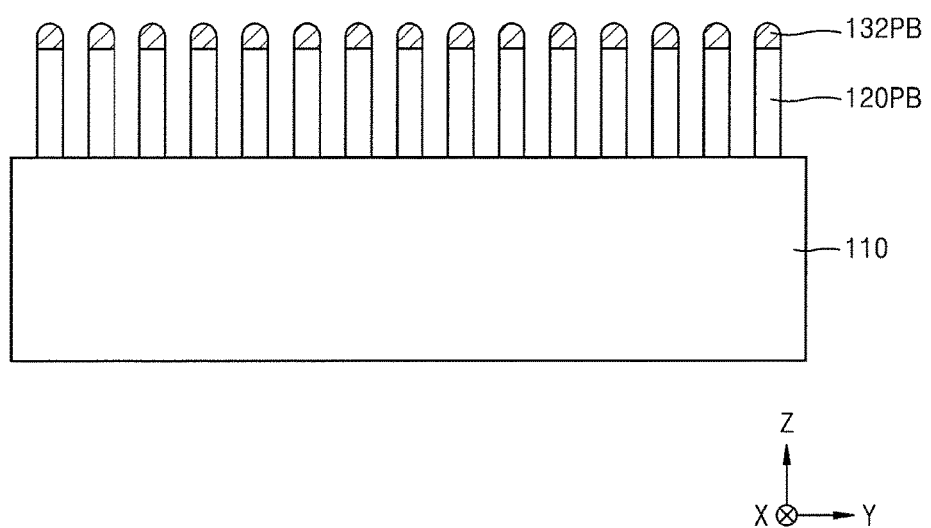

Referring to FIG. 31, a feature pattern 120PB may be formed by etching the feature layer 120 with the plurality of reference patterns 134PB and the plurality of buried patterns 150PB as etch masks.

Figure 32:
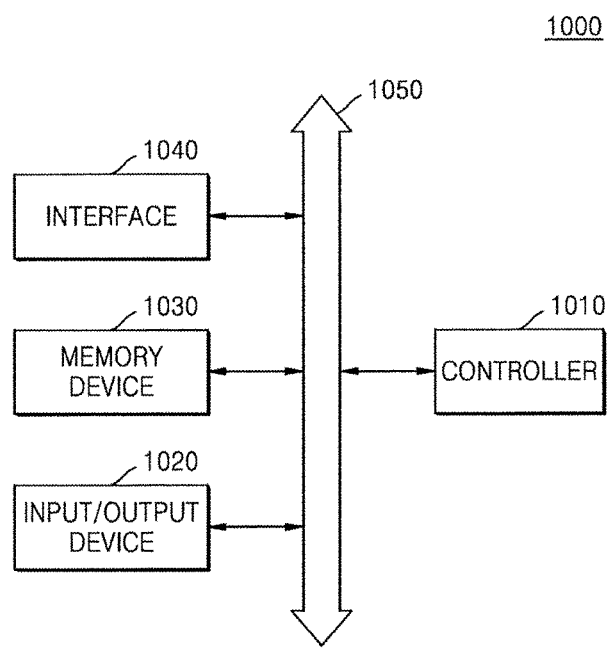
FIG. 32 illustrates a block diagram of a system including a semiconductor device manufactured according to embodiments.

FIG. 32 illustrates a block diagram of a system 1000 including a semiconductor device manufactured according to embodiments.

Referring to FIG. 32, the system 1000 may include a controller 1010, an input/output (I/O) device 1020, a memory device 1030, and an interface 1040. The system 1000 may be a mobile system or a system which transmits or receives information. In some embodiments, the mobile system may include a personal digital assistant (PDA), a portable computer, a web tablet, a wireless phone, a mobile phone, a digital music player, or a memory card. The controller 1010 may control an execution program in the system 1000. The controller 1010 may include a microprocessor, a digital signal processor, a microcontroller, or a device similar thereto. The I/O device 1020 may be used to input or output data to or from the system 1000. The system 1000 may be connected to an external device (for example, a personal computer or a network) by using the I/O device 1020, and may exchange data with the external device. The I/O device 1020 may include, for example, a keypad, a keyboard, or a display.

The memory device 1030 may store a code and/or data that are/is used for an operation of the controller 1010, or store data obtained through processing of the controller 1010. The memory device 1030 may include at least one semiconductor device obtained by the method of manufacturing a semiconductor device according to embodiments.

The interface 1040 may be a data transmission path between the system 1000 and another external device. The controller 1010, the I/O device 1020, the memory device 1030, and the interface 1040 may communicate with each other through a bus 1050. The system 1000 may be applied to mobile phones, MP3 players, navigation, portable multimedia players (PMPs), solid state disks (SSDs), and household appliances.

Figure 33:
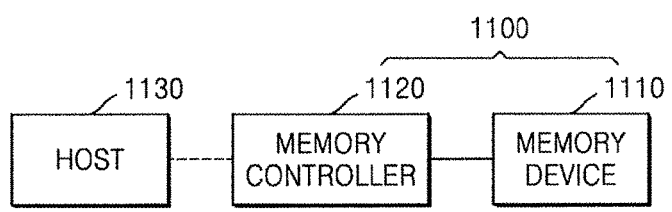
FIG. 33 illustrates a block diagram of a memory card including a semiconductor device manufactured according to embodiments.

FIG. 33 is a block diagram of a memory card 1100 including a semiconductor device manufactured according to embodiments.

Referring to FIG. 22, the memory card 1100 may include a memory device 1110 and a memory controller 1120.

The memory device 1110 may store data. In some embodiments, the memory device 1110 may have nonvolatile characteristic where stored data is maintained as-is even when the supply of power is stopped. The memory device 1110 may include at least one semiconductor device obtained by the method of manufacturing a semiconductor device according to embodiments.

In response to a read/write request of a host 1130, the memory controller 1120 may read data stored in the memory device 1110 or may store data in the memory device 1110. The memory controller 1120 may include at least one semiconductor device obtained by the method of manufacturing a semiconductor device according to embodiments.

By way of summation and review, embodiments provide a method of manufacturing a semiconductor device, which reduces a critical dimension (CD) variation of fine patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming a feature layer on a substrate;
   forming a plurality of reference patterns, arranged at a first pitch, on the feature layer;
   forming an organic liner on a side wall of each of the plurality of reference patterns;
   forming a plurality of buried patterns on the organic liner, each of the plurality of buried patterns covering a space between side walls of two adjacent reference patterns among the plurality of reference patterns;
   removing the organic liner exposed between the plurality of buried patterns and the plurality of reference patterns; and
   etching the feature layer by using the plurality of buried patterns and the plurality of reference patterns as etch masks to form a feature pattern.

2. The method as claimed in claim 1, wherein forming the organic liner includes:
forming an organic coating layer on the plurality of reference patterns, the organic coating layer including an organic compound;
performing a first baking treatment to form the organic liner by self-aligning the organic compound included in the organic coating layer on a top and the side wall of each of the plurality of reference patterns; and
removing the organic coating layer on the organic liner.

3. The method as claimed in claim 2, wherein the organic compound includes a C5-C50 aliphatic hydrocarbon compound, a portion of which is substituted with a hydrophilic functional group, a C5-050 aromatic hydrocarbon compound, a portion of which is substituted with a hydrophilic functional group, or derivatives thereof.

4. The method as claimed in claim 2, wherein the organic compound includes a polymer wherein a repeating unit of the polymer is a C5-C50 aliphatic hydrocarbon compound, a portion of which is substituted with a hydrophilic functional group a polymer wherein a repeating unit of the polymer is a C5-C50 aromatic hydrocarbon compound, a portion of which is substituted with a hydrophilic functional group.

5. The method as claimed in claim 1, further comprising: before forming the organic liner, performing a surface treatment on the plurality of reference patterns for the side wall of each of the plurality of reference patterns to provide a hydrophilic surface thereon.

6. The method as claimed in claim 1, wherein forming the plurality of buried patterns includes:
forming a buried layer with an inorganic material on the organic liner to cover the plurality of reference patterns, and
planarizing an upper portion of each of the buried layer and the organic liner until a top of each of the plurality of reference patterns is exposed.

7. The method as claimed in claim 6, wherein the organic liner has an etch selectivity greater than 5:1 with respect to at least one of the plurality of reference patterns and the plurality of buried patterns.

8. The method as claimed in claim 2, further comprising: performing a second baking treatment on the organic liner after removing the organic coating layer.

9. The method as claimed in claim 1, wherein the plurality of reference patterns include a line-shaped pattern extending along a first direction parallel to a top of the substrate.

10. The method as claimed in claim 1, wherein the plurality of reference patterns include a plurality of island-shaped patterns that are spaced apart from each other in a first direction parallel to a top of the substrate and in a second direction that is parallel to the top of the substrate and differs from the first direction.

11. The method as claimed in claim 1, wherein forming the plurality of reference patterns includes:
forming a plurality of material layer patterns on the feature layer;
forming a preliminary reference pattern layer conformally covering the feature layer and side walls of the plurality of material layer patterns;
performing an anisotropic etching process on the preliminary reference pattern layer to expose a top of the feature layer and form the plurality of reference patterns on the side walls of the plurality of material layer patterns; and
removing the plurality of material layer patterns.

12. A method of manufacturing a semiconductor device, the method comprising:
forming a feature layer on a substrate;
forming a plurality of reference patterns, arranged at a first pitch, on the feature layer;
forming an organic coating layer on the plurality of reference patterns, the organic coating layer including an organic compound;
performing a first baking treatment to self-align the organic compound included in the organic coating layer on a side wall and a top of each of the plurality of reference patterns to form an organic liner on the side wall of each of the plurality of reference patterns;
forming a plurality of buried patterns on the organic liner, each of the plurality of buried patterns covering a space between side walls of two adjacent reference patterns among the plurality of reference patterns;
removing the organic liner exposed between the plurality of buried patterns and the plurality of reference patterns; and
etching the feature layer by using the plurality of buried patterns and the plurality of reference patterns as etch masks to form a feature pattern.

13. The method as claimed in claim 12, further comprising: before the forming of the organic liner, performing a surface treatment on the plurality of reference patterns for the side wall of each of the plurality of reference patterns to have a hydrophilic surface.

14. The method as claimed in claim 12, wherein:
the organic compound includes a C5-C50 aliphatic hydrocarbon compound, a portion of which is substituted with a hydrophilic functional group, a C5-050 aromatic hydrocarbon compound, a portion of which is substituted with a hydrophilic functional group, a polymer wherein a repeating unit of the polymer is a C5-C50 aliphatic hydrocarbon compound, a portion of which is substituted with a hydrophilic functional group, or a polymer wherein a repeating unit of the polymer is a C5-050 aromatic hydrocarbon compound, a portion of which is substituted with a hydrophilic functional group.

15. The method as claimed in claim 12, wherein the organic liner has an etch selectivity greater than 5:1 with respect to at least one of the plurality of reference patterns and the plurality of buried patterns.

16. A method of manufacturing a semiconductor device, the method comprising:
forming a feature layer on a substrate, the substrate including a main pattern region and an edge region, and forming a preliminary reference pattern layer on an inorganic material on the feature layer;
forming a plurality of reference patterns arranged at a first pitch from the preliminary reference pattern layer in the main pattern region and forming an edge pattern from the preliminary reference pattern layer in the edge region;
performing a surface treatment on the reference patterns in the main pattern region and on the edge pattern in the edge region such that exposed surfaces of the reference patterns and the edge pattern are hydrophilic;
forming an organic coating layer on the reference patterns and the edge pattern, the organic coating layer including an organic compound having a hydrophilic functional group;
performing a baking treatment such that the organic compound included in the organic coating layer self-aligns with surfaces of the reference patterns and the edge pattern to form an organic liner on side walls and tops of the reference patterns and the edge pattern;

removing portions of the organic coating layer that were not self-aligned with surfaces of the reference patterns and the edge pattern to form the organic liner, such that the organic liner remains on side walls and tops of the reference patterns and the edge pattern;

forming a plurality of buried patterns of an inorganic material on the organic liner, the buried patterns filling spaces between side walls of adjacent reference patterns;

removing portions of the organic liner that are between the buried patterns and reference patterns; and etching the feature layer using the buried patterns and the reference patterns as etch masks to form a feature pattern.

17. The method as claimed in claim 16, wherein the organic liner is formed such that a thickness on tops of the reference patterns and on the edge pattern is substantially uniform.

18. The method as claimed in claim 17, wherein the buried patterns are formed by:

depositing an inorganic material by a deposition process on the organic liner to form a buried layer filling spaces between side walls of adjacent reference patterns and covering tops of the reference patterns and the edge pattern, such that a thickness of the buried layer on the tops of the reference patterns and on the edge pattern is substantially uniform, and planarizing the buried layer to remove an upper portion of the buried layer and a portion of the organic liner above the tops of the reference patterns and on the edge pattern.

19. The method as claimed in claim 16, wherein the organic liner has an etch selectivity greater than 5:1 with respect to at least one of the plurality of reference patterns and the plurality of buried patterns.

20. The method as claimed in claim 16, wherein:

the organic compound included in the organic coating layer includes a C5-C50 aliphatic hydrocarbon compound, a portion of which is substituted with a hydrophilic functional group, a C5-C50 aromatic hydrocarbon compound, a portion of which is substituted with a hydrophilic functional group, a polymer wherein a repeating unit of the polymer is a C5-C50 aliphatic hydrocarbon compound, a portion of which is substituted with a hydrophilic functional group, or a polymer wherein a repeating unit of the polymer is a C5-050 aromatic hydrocarbon compound, a portion of which is substituted with a hydrophilic functional group, and a thickness of the organic liner formed on the reference pattern and the edge pattern is predetermined according to a selection of the organic compound included in the organic coating layer.

* * * * *